(12) United States Patent
Lee et al.

(10) Patent No.: US 8,957,882 B2
(45) Date of Patent: Feb. 17, 2015

(54) GATE DRIVE CIRCUIT AND DISPLAY APPARATUS HAVING THE SAME

(75) Inventors: Jae-Hoon Lee, Seoul (KR); Young-Su Kim, Daegu (KR); Whee-Won Lee, Busan (KR); Jun-Yong Song, Hwaseong-si (KR); Yu-Han Bae, Seoul (KR); You-Mee Hyun, Anyang-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 445 days.

(21) Appl. No.: 13/292,661

(22) Filed: Nov. 9, 2011

(65) Prior Publication Data

US 2012/0139883 A1 Jun. 7, 2012

(30) Foreign Application Priority Data

Dec. 2, 2010 (KR) .................. 10-2010-0121728
Jul. 25, 2011 (KR) .................. 10-2011-0073560

(51) Int. Cl.
*G06F 3/038* (2013.01)
*G09G 3/36* (2006.01)
*G11C 19/28* (2006.01)

(52) U.S. Cl.
CPC ............ *G09G 3/3611* (2013.01); *G09G 3/3677* (2013.01); *G11C 19/28* (2013.01); *G09G 2310/0286* (2013.01); *G09G 2300/0408* (2013.01); *G09G 2320/041* (2013.01)

USPC .......................................... 345/204; 345/101

(58) Field of Classification Search
CPC ............................................. G09G 2310/0286
See application file for complete search history.

(56) References Cited

U.S. PATENT DOCUMENTS

2003/0184538 A1* 10/2003 Yamato et al. ................ 345/211
2010/0097368 A1*  4/2010 Hwang ........................ 345/213

FOREIGN PATENT DOCUMENTS

| JP | 4597109 | 10/2010 |
| KR | 1020100013931 | 2/2010 |
| KR | 1020100021234 | 2/2010 |
| KR | 1020100119119 | 11/2010 |

* cited by examiner

*Primary Examiner* — Srilakshmi K Kumar
*Assistant Examiner* — Carl Adams
(74) *Attorney, Agent, or Firm* — F. Chau & Associates, LLC

(57) ABSTRACT

A gate drive circuit includes a shift register in which plural stages are cascade-connected to each other. In an n-th stage, a pull-up part outputs a high voltage of a clock signal to an output node as a high voltage of an n-th gate signal in response to a high voltage on a first node. A pull-down part pulls the high voltage of the n-th gate signal down to a first low voltage in response to an (n+1)th carry signal. A discharging part discharges the first node to a second low voltage level lower than the first low voltage level in response to the (n+1)th carry signal. A carry part outputs the high voltage of the clock signal as an n-th carry signal (mirroring the n-th gate signal) in response to a high voltage on the first node.

35 Claims, 25 Drawing Sheets

GATE DRIVE CIRCUIT AND DISPLAY APPARATUS HAVING THE SAME

PRIORITY STATEMENT

This application claims priority, under 35 U.S.C. §119, of Korean Patent Application No. 2010-121728, filed on Dec. 2, 2010 and Korean Patent Application No. 2011-0073560, filed on Jul. 25, 2011 in the Korean Intellectual Property Office (KIPO), the contents of which are herein incorporated by reference in their entireties.

BACKGROUND OF THE INVENTION

1. Field of the Invention

Exemplary embodiments of the present invention relate to a gate drive circuit and a display apparatus having the gate drive circuit. More particularly, exemplary embodiments of the present invention relate to a gate drive circuit, an integrated area of which is decreased and a display apparatus having the gate drive circuit.

2. Description of the Related Art

Generally, a liquid crystal display ("LCD") device includes an LCD panel that displays images using a light-transmitting ratio of liquid crystal molecules, and a backlight assembly disposed below the LCD panel to provide the LCD panel with light.

The LCD device includes a display panel in which a plurality of pixels connected to gate lines and data lines crossing the gate lines is formed, a gate drive circuit outputting a gate signal to the gate line and a data drive circuit outputting a data signal to the data line. The gate drive circuit and the data drive circuit may be formed as a chip type to be formed on the display panel.

In order to decrease a total size of a gate drive circuit and to reduce the size of an LCD and to simplify the manufacture of the LCD, a process in which the gate driving circuit is integrated in an amorphous silicon layer deposited on a display substrate has been developed. This is known as amorphous silicon gate ("ASG") type gate drive circuit. When the gate driving circuit integrated in the integrated circuit formed on the display substrate is driven in high temperature conditions, visible noise defects such as ripples may be generated during a "gate-OFF signal" period.

When the temperature of the gate drive circuit is increased due to a long operating time, a high temperature noise is generated in the gate signal. Thus, in order to reduce the high temperature noise, a structure including various holding parts has been developed. When various holding parts are added to the gate drive circuit, the integrated circuit area may be increased.

The high temperature margin of an ASG type gate drive circuit is desirable. Meanwhile, the integrated circuit area of the ASG type gate drive circuit should be decreased.

SUMMARY OF THE INVENTION

Exemplary embodiments of the present invention provide a amorphous silicon gate ("ASG") type gate drive circuit capable of enhancing a driving reliability thereof and capable of decreasing the integrated circuit area thereof.

Exemplary embodiments of the present invention also provide a display device having the above-mentioned gate drive circuit.

According to one aspect of the present invention, a gate drive circuit includes a shift register in which plural stages are cascade-connected to each other. An n-th stage ('n' is a natural number) includes a pull-up part, a pull-down part, a discharging part, a carry part and a first holding part. The pull-up part outputs a high voltage of a clock signal as the high voltage of an n-th gate signal in response to a high voltage on a first node. The pull-down part pulls down the high voltage of an n-th gate signal to a first low voltage in response to an (n+1)th carry signal (mirroring an (n+1)th gate signal). The discharging part discharges the first node down to the second voltage level in response to the (n+1)th carry signal received at a second input terminal. The carry part outputs the high voltage of the clock signal as an n-th carry signal in response to a high voltage of the first node. The first holding part holds the carry signal down to the second low voltage in response to the clock signal.

In an exemplary embodiment, the pull-up part consists of a first transistor and the voltage between the control gate of the first transistor and the output electrode of the first transistor is maintained as a negative voltage (after the high voltage pulse of the n-th gate signal is outputted).

In an exemplary embodiment, the gate drive circuit may further include a second holding part maintaining the down voltage of the first node at the second low voltage in response to the clock signal.

In an exemplary embodiment, the discharging part includes a first discharging switch and a second discharging switch. The first discharging switch discharges the high voltage of the first node down to the first low voltage in response to the (n+1)th carry signal. The second discharging switch discharges the high voltage of the first node down to the second low voltage in response to the (n+2)th carry signal.

In an exemplary embodiment, the gate drive circuit further includes a third holding part maintaining the n-th gate signal at the first low voltage in response to the clock signal.

In an exemplary embodiment, the discharging part includes first discharging part and a second discharging part. The first discharging part discharges a high voltage of the first node to the second low voltage in response to the (n+1)th carry signal. The second discharging part discharges a high voltage of the first node to the second low voltage in response to the (n+2)th carry signal.

In an exemplary embodiment, the gate drive circuit may further include a third holding part maintaining the n-th gate signal at the first low voltage in response to the clock signal.

In an exemplary embodiment, the discharging part includes first discharging part, a sub-discharging resistance and a second discharging part. The first discharging part discharges a high voltage of the first node to the second low voltage in response to the (n+1)th carry signal. The second discharging part discharges a high voltage of the first node to the second low voltage in response to the (n+2)th carry signal. In some exemplary embodiments, the second discharging part discharges the high voltage of the first node to the second low voltage through the sub-discharging resistance.

In an exemplary embodiment, the gate drive circuit may further include a third holding part maintaining the n-th gate signal at the first low voltage in response to the clock signal.

In an exemplary embodiment, the discharging part may discharge a high voltage of the first node to the second low voltage in response to the (n+1)th carry signal.

In an exemplary embodiment, the gate drive circuit may further include a third holding part maintaining the n-th gate signal at the first low voltage in response to the clock signal.

In an exemplary embodiment, the gate drive circuit may include eleven to fifteen transistors. Some of the 15 transistors are configured to operate as ON/OFF switches, and some of the 15 transistors are configured to operate as resistances.

In an exemplary embodiment, the gate drive circuit may further include a buffer part consisting of transistor having its control gate connected to a first input terminal receiving an (n−1)th carry signal, its input electrode commonly connected to the first input terminal and its output electrode connected to the first node.

In an exemplary embodiment, the gate drive circuit may further include a charging capacitor having its first terminal connected to the first node and its second terminal connected to an output node outputting the n-th gate signal.

In an exemplary embodiment, the gate drive circuit may further include a switching part outputting a signal synchronized with the clock signal (during the remaining time interval of an output interval of the n-th carry signal).

According to another aspect of the present invention, a gate drive circuit includes a shift register in which plural stages are cascade-connected to each other. An n-th stage ('n' is a natural number) includes a pull-up part, a pull-down part, a first discharging part, a carry part and a second discharging part. The pull-up part outputs a high voltage of a clock signal as the high voltage of the n-th gate signal in response to a high voltage of a control node. The pull-down part pulls down the high voltage of the n-th gate signal to a first low voltage level in response to the (n+1)th carry signal outputted from the following (n+1)th stage. The first discharging part discharges the high voltage of the control node into the first low voltage or a second low voltage lower than the first low voltage in response to the (n+1) carry signal outputted from the following (n+1) stage. The carry part outputs the high voltage of the clock signal as an n-th carry signal in response to the high voltage of the control node. The second discharging part discharges the n-th carry signal into the second low voltage in response to the (n+1)th carry signal outputted from the following (n+1)th stage.

According to still another one aspect of the present invention, a display apparatus includes a display panel, a source drive circuit and a gate drive circuit. The display panel includes a display area on which gate lines and source lines crossing the gate lines are formed to display an image and a peripheral area surrounding the display area. The source drive circuit outputs data signals to the source lines. The gate drive circuit includes a shift register in which plural stages are cascade-connected to each other. An n-th stage ('n' is a natural number) includes a pull-up part, a pull-down part, a discharging part, a carry part and a first holding part. The pull-up part outputs a high voltage of a clock signal as a high voltage of an n-th gate signal (on the output node) in response to a high voltage of a first node. The pull-down part pulls down the high voltage of an n-th gate signal (on the output node) to a first low voltage in response to an (n+1)th carry signal. The discharging part discharges a signal of the first node to the second voltage level in response to the second input signal. The carry part outputs the high voltage of the clock signal as an n-th carry signal in response to a high voltage of the first node. The first holding part maintains the carry signal to the second low voltage in response to the clock signal.

In an exemplary embodiment, the pull-up part consists of a first transistor and the voltage between the control gate and the output electrode of the first transistor may be maintained as a negative voltage after a high voltage of the n-th gate signal is outputted.

In an exemplary embodiment, the n-th stage may further include a second holding part maintaining a voltage of the first node, down at the second low voltage in response to the clock signal.

In an exemplary embodiment, the n-th stage may further include a third holding part maintaining the n-th gate signal at the first low voltage in response to the clock signal.

In an exemplary embodiment, the discharging part includes first discharging part and a second discharging part. The first discharging part discharges a high voltage of the first node to the first low voltage in response to the (n+1)th carry signal. The second discharging part discharges a high voltage of the first node to the second low voltage in response to the (n+2)th carry signal.

In an exemplary embodiment, the discharging part includes first discharging switch and a second discharging switch. The first discharging switch discharges a high voltage of the first node to the second low voltage in response to the (n+1)th carry signal. The second discharging switch discharges a high voltage of the first node to the second low voltage in response to the (n+2)th carry signal.

In an exemplary embodiment, the discharging part includes first discharging switch, a sub-discharging resistance and a second discharging switch. The first discharging switch discharges a high voltage of the first node to the second low voltage in response to the (n+1)th carry signal. The second discharging switch discharges a high voltage of the first node to the second low voltage in response to the (n+2)th carry signal. The sub-discharging resistance slows the discharge of the high voltage of the first node to the second low voltage.

In an exemplary embodiment, the discharging part may discharge a high voltage of the first node to the second low voltage in response to the (n+1)th carry signal.

According to still another aspect of the present invention, a display apparatus includes a display panel, a source drive circuit and a gate drive circuit. The display panel includes a display area on which gate lines and source lines crossing the gate line are formed to display an image and a peripheral area surrounding the display area. The source drive circuit outputs data signals to the source lines. The gate drive circuit includes a shift register in which plural stages are connected one after another to each other. An n-th stage ('n' is a natural number) includes a pull-up part, a pull-down part, a first discharging part, a carry part outputting and a second discharging part. The pull-up part outputs a high voltage of the clock signal as the high voltage of the n-th gate signal in response to a high voltage of a control node. The pull-down part pulls down the high voltage of the n-th gate signal to a first low voltage level in response to the (n+1)th carry signal outputted from the following (n+1)th stage. The first discharging part discharges the high voltage of the control node into the first low voltage or a second low voltage lower than the first low voltage in response to the (n+1)th carry signal outputted from the following (n+1)th stage. The carry part outputs the high voltage of the clock signal as an n-th carry signal in response to the high voltage of the control node. The second discharging part discharges the n-th carry signal into the second low voltage in response to the (n+1)th carry signal outputted from the following (n+1)th stage.

According to some exemplary embodiments of the present invention, a voltage between the control gate and the output electrode of the first transistor in the pull-up part has a negative voltage after gate signals are outputted, so that conventionally added transistors for controlling noise may be omitted. Thus, the integrated area of the gate drive circuit may be decreased. Moreover, power consumption may be decreased. Furthermore, the voltage at the carry node is stably maintained at a low voltage, so that the driving reliability of the gate drive circuit may be enhanced.

BRIEF DESCRIPTION OF THE DRAWINGS

The above and other features of the present invention will become more apparent by describing in detailed exemplary embodiments thereof with reference to the accompanying drawings, in which.

DETAILED DESCRIPTION OF THE INVENTION

Figure 1:
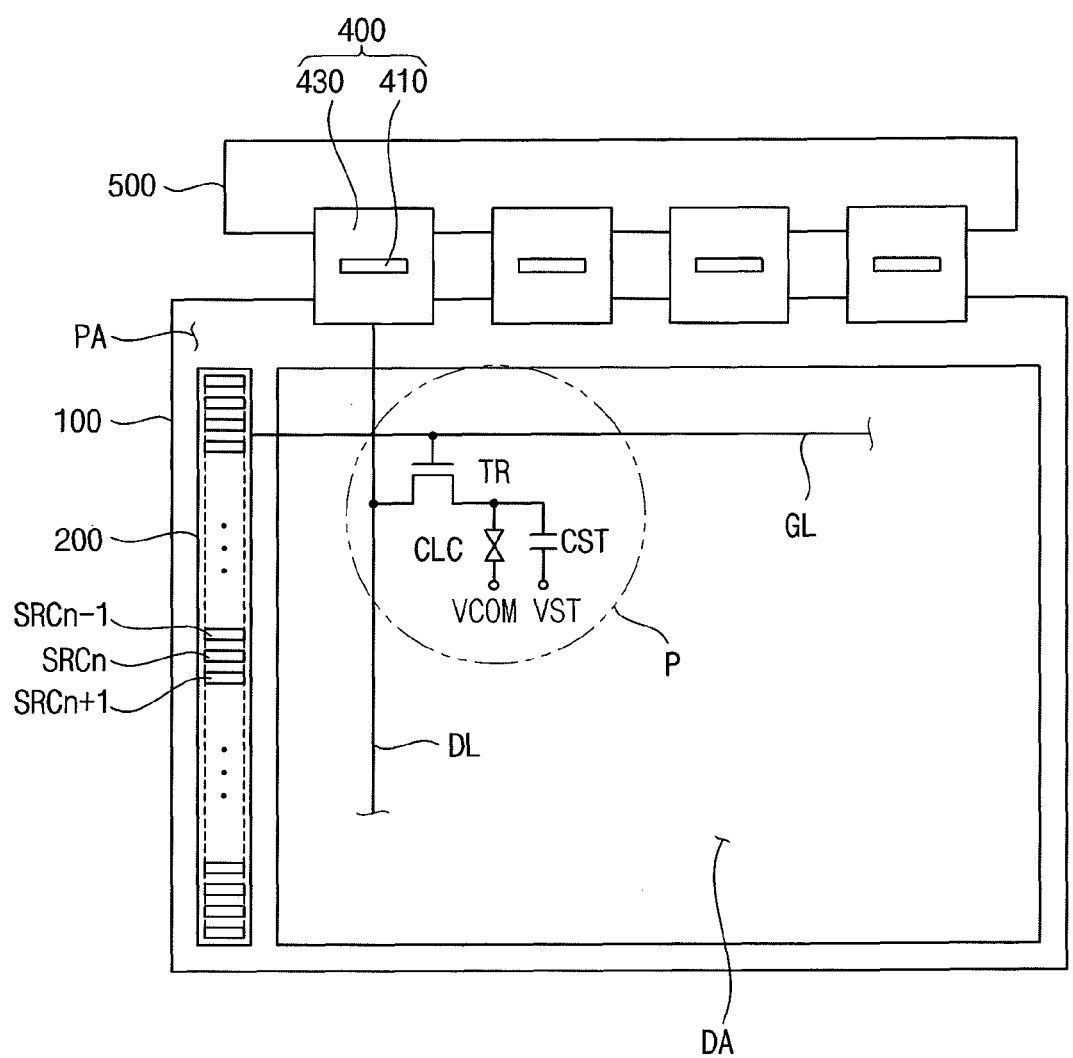
FIG. 1 is a schematic plan view of a display apparatus configured to include the gate drive circuit 200 (200-1) of FIG. 2 or the gate drive circuit 200 (200-2) of FIG. 22, according to an exemplary embodiment of the invention.

FIG. 1 is a schematic plan view of a display apparatus comprising a gate drive circuit including stages SRCn according to an exemplary embodiment of the present invention.

Referring to FIG. 1, the display apparatus includes a display panel 100, a gate drive circuit 200, a source drive circuit 400 and a printed circuit board ("PCB") 500.

The display panel 100 includes a display area DA and a peripheral area PA surrounding the display area DA. A plurality of gate lines GL, a plurality of source lines DL and a plurality of pixels P are formed on the display area DA. The gate lines and the source lines cross each other. Each of the pixels P includes a switching element (transistor) TR electrically having its control gate connected to the gate line GL of that pixel P. The switching element (transistor) TR is connected between the source line DL and a liquid crystal capacitor CLC electrically connected to the switching element TR, and a storage capacitor CST connected in parallel to the liquid crystal capacitor CLC.

The gate drive circuit 200 (e.g., 200-1 of FIG. 2 or 200-2 of FIG. 22) includes a shift register that sequentially outputs gate signals of a high level to the plurality m of gate lines GLs. The shift register includes a plurality m of stages (e.g., SRCn–1, SRCn and SRCn+1, wherein 'n' is a natural number). The gate drive circuit 200 is integrated in the peripheral area PA adjacent to a first terminal end of the gate lines GL. In the present exemplary embodiment, the gate drive circuit 200 is integrated on a first end portion of the gate lines GLs. In alternative embodiments, the gate drive circuit 200 may be integrated on two end portions of the gate lines GLs.

The source drive circuit 400 includes a source drive chip 410 and a flexible circuit substrate 430. The source drive chip 410 is mounted on the flexible circuit substrate 430 to provide the source lines DLs with data signals. The flexible circuit substrate 430 makes electrical contact with the PCB 500 and with the display panel 100. In this exemplary embodiment, the source drive chip 410 is mounted on the flexible circuit substrate 430. Alternatively, the source drive chip 410 is directly mounted on the display panel 100. Alternatively, the source drive chip 410 may be directly integrated in the peripheral area PA of the display panel 100.

Figure 2:
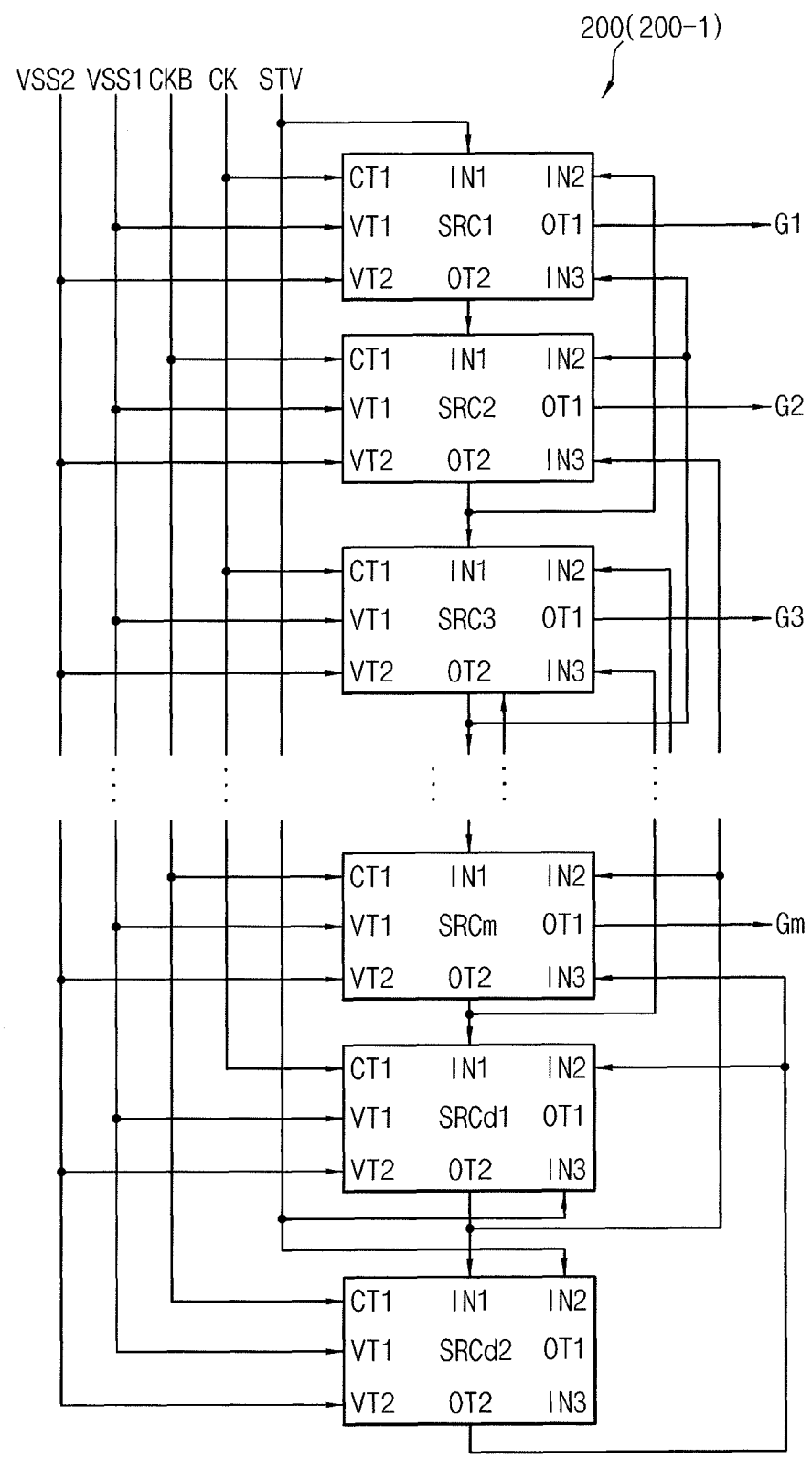
FIG. 2 is a block diagram of a gate drive circuit 200 (200-1) in the display apparatus of FIG. 1 according to an exemplary embodiment of the present invention.

FIG. 2 is a block diagram of the gate drive circuit 200 (200-1) in the display apparatus of FIG. 1.

Referring to FIG. 2, the gate drive circuit 200-1 includes a shift register including first to m th (non-dummy) stages SCR1 to SRCm that are cascade-connected to each other, a first dummy stage SRCd1 and a second dummy stage SRCd2. In this embodiment, 'm' is a natural number.

The first to m-th stages SRC1 to SRCm are respectively connected to m gate lines to sequentially provide the gate lines with m gate signals. A first dummy stage SRCd1 helps to control driving of the (m−1)th stage SRCm−1 and the m-th stage SRCm. A second dummy stage SRCd2 helps to control driving of the m-th stage SRCm and the first dummy stage STCd1. The first and second dummy stages SRCd1 and SRCd2 are not connected to gate lines.

Each of the stages includes a first clock terminal CT1, a first input terminal IN1, a second input terminal IN2, a third input terminal IN3, a first voltage terminal VT1, a second voltage terminal VT2, a first output terminal OT1 and a second output terminal OT2 (connected to a gate line GL).

The first clock terminal CT1 receives a first clock signal or a second clock signal different from the first clock signal. For example, the second clock signal may have a phase opposite to the first clock signal. Hereinafter, the first clock signal will be referred to as a clock signal CK, and the second clock signal will be referred to as an inverted clock signal CKB.

For example, the first clock terminals CT1 of odd-numbered stages SRC1, SRC3, . . . , SRCd1 receive the clock signal CK, and the first clock terminals CT1 of even-numbered stages SRC2, SRC4, . . . , SRCd2 receive the inverted clock signal CKB. The clock signal CK and the inverted clock signal CKB alternate periodically between a high voltage VDD and a first low voltage VSS1.

The first input terminal IN1 of the first stage SRC1 receives a vertical start signal STV or one of the carry signals outputted from previous stages. The second output terminal OT2 of an n-th stage SRCn outputs the carry signal CRn. The first input terminal IN1 of the n-th stage SRCn receives an (n−1)th carry signal CRn−1. For example, the first input terminals IN1 of the second stage SRC2 receive the 1st carry signal CR1.

The second input terminal IN2 receives one of carry signals CR (OT) outputted from a following stage or the vertical start signal STY. For example, the second input terminal IN2 of the first stage SRC1 receives the 1st carry signal CR1; and the second input terminal IN2 of the first dummy stage SRCd1 receives the m-th carry signal CRm; and the second input terminal IN2 of the second dummy stage SRCd2 receives the vertical start signal STV. The vertical signal STV received by the second input terminal IN2 of the second dummy stage SRCd2 may be the vertical start signal corresponding to the following frame.

The third input terminal IN3 receives one of the carry signals CR (OT) outputted from a following stage or the vertical start signal STV. The third input terminals IN3 of the first to m-th stages SRC1 to SRCm receive the (n+2)th carry signal CRn+2, respectively. The third input terminal IN3 of the first dummy stage SRCd1 receives the vertical start signal STV.

The first voltage terminal VT1 of each stage receives the first low voltage VSS1. The first low voltage VSS1 has a first low level. The first low level corresponds to a discharging level of the gate signal. For example, the first low level may be about −6 V.

The second voltage terminal VT2 of each stage receives a second low voltage VSS2 having a second low level lower than the first low level. The second low level corresponds to a discharging level of a first node Q (hereinafter, Q node) included in the stage. For example, the second low level may be about −10 V.

The first output terminal OT1 is electrically connected to a corresponding gate line to output the gate signal Gn (e.g., G1, G2, . . . Gm). The first output terminals OT1 of the first to m-th stage SRC1 to SRCm output first to m-th gate signals (G1, G2, . . . Gm), respectively. The first output terminals OT1 of the first and second dummy stages SRCd1 and SRCd2 do not output gate signals.

The second output terminal OT2 of the n-th stage SRCn outputs the n-th carry signal CRn. The second output terminal OT2 of the n-th stage SRCn is electrically connected to the first input terminal IN1 of the next (n+1)th stage SRCn+1. Moreover, the second output terminal OT2 is electrically connected to a second input terminal IN2 of a previous (n−1) th stage SRCn−1 and to a third input terminal IN3 of a previous (n−2)th stage SRCn−2.

Figure 3:
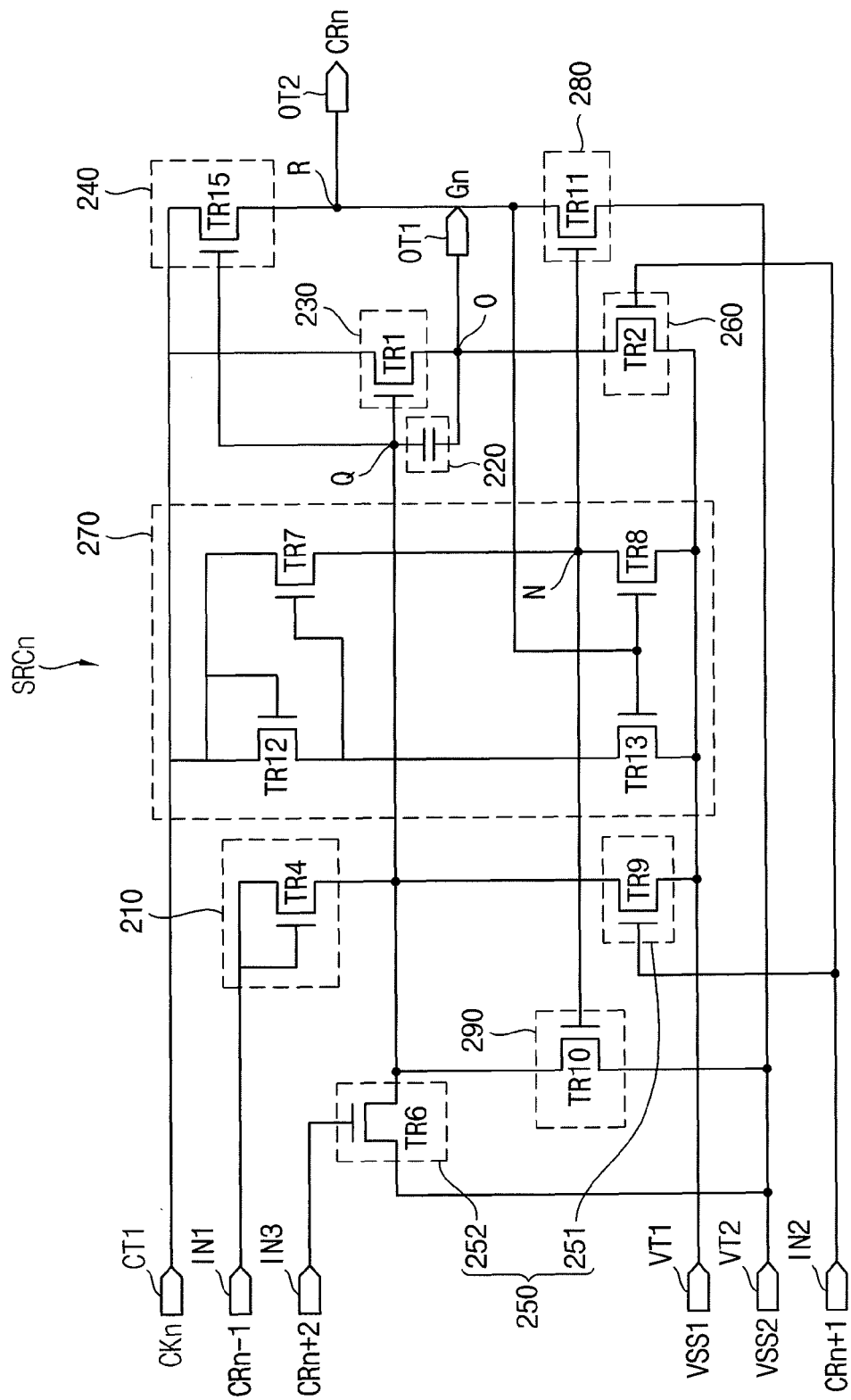
FIG. 3 is a circuit diagram of a first version of the n-th stage SRCn (version 1) of the gate drive circuit 200-1 of FIG. 2 according to an exemplary embodiment of the present invention.
Figure 4:
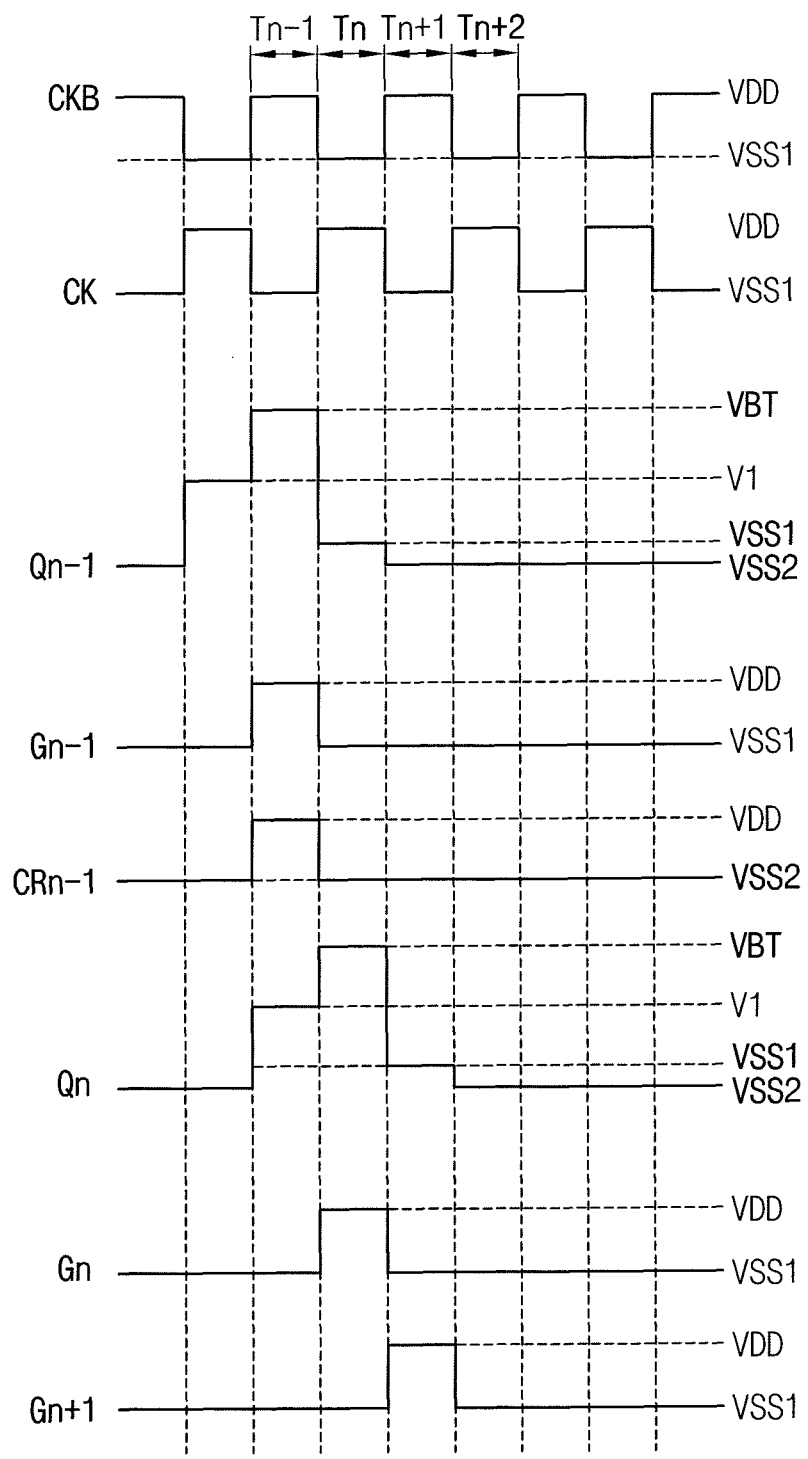
FIG. 4 is a waveform diagram showing timing and voltages of signals of the n-th stage SRCn of FIG. 3.

FIG. 3 is a circuit diagram of the n-th a stage SRCn of the gate drive circuit 200-1 of FIG. 2, according to an exemplary embodiment of the present invention. FIG. 4 is a waveform diagram showing timing and voltages of signals of the n-th stage SRCn of FIG. 3.

Referring to FIGS. 3 and 4, an n-th stage SRCn includes a buffer part 210, a charging part 220, a pull-up part 230, a carry part 240, a discharging part 250, a pull-down part 260, a switching part 270, a first holding part 280 and a second holding part 290.

The buffer part 210 delivers the (n−1)th carry signal CRn−1 to the pull-up part 230. The buffer part 210 includes a fourth transistor TR4. The fourth transistor TR4 includes a control gate and an input electrode that are connected to the first input terminal IN1 and an output electrode connected to the Q node Q.

The charging part 220 includes a capacitor charged in response to the (n−1)th carry signal CRn−1 provided from the buffer part 210. A first terminal of the capacitor of the charging part 220 is connected to the Q node Q, and a second terminal of the capacitor is connected to an output node O from which the nth gate signal Gn is outputted. When a high voltage VDD of the (n−1)th carry signal CRn−1 is applied to the buffer part 210, the capacitor of the charging part 220 charges to store a first voltage V1 corresponding to the high voltage VDD.

The pull-up part 230 pulls up the output node O from which the nth gate signal Gn is outputted. The pull-up part 230 includes a first transistor TR1. The first transistor TR1 includes a control gate connected to the Q node Q, an input electrode connected to the first clock terminal CT1 and an output electrode connected to the output electrode O. The output node O is connected to the first output terminal OT1.

In a state in which the first voltage V1 stored by the charging part 220 is applied to a control electrode of the pull-up part 230 and the first transistor TR1 is ON, when the first clock terminal CT1 receives a high voltage VDD of the clock signal CK, the pull-up part 230 is bootstrapped. In this case, the Q node Q connected to the control electrode of the pull-up part 230 is boosted up to a boosted voltage VBT greater than the first voltage V1. Thus, the Q node Q has the first voltage V1 at an (n−1)th time interval Tn−1, and has the boosted voltage VBT at an n-th time interval Tn. The n-th time interval Tn corresponds to the time interval during which the nth stage SRCn is supposed to output an active voltage (e.g., VDD) Gn on the nth gate line. The (n−1)th time interval Tn−1, corresponds to the time interval during which the previous (n−1)th stage SRC(n−1) is supposed to output an active voltage (e.g., VDD) G(n−1) on the (n−1)th gate line.

During the n-th time interval Tn in which the boosted voltage VBT is applied to the control electrode of the pull-up part 230, the pull-up part 230 outputs a high voltage VDD of the clock signal CK as a high voltage VDD of an n-th gate signal Gn. The n-th gate signal Gn is outputted through the first output terminal OT1 connected to the output node O.

The pull-down part 260 pulls-down the n-th gate signal Gn. The pull-down part 260 includes second transistor TR2. The second transistor TR2 includes a control gate connected to the second input terminal IN2, an input electrode connected to the output node and an output electrode connected to the first voltage terminal VT1. When an active-high (n+1)th gate signal Gn+1 (mirrored by carry part CRn+1) is applied to the second input terminal IN2, the pull-down part 260 pulls-down the voltage of the output node O to the first low voltage VSS1 applied to the first voltage terminal VT1.

The carry part 240 outputs at an R node R the active-high carry signal CRn which mirrors the active-high gate signal Gn. The carry part 240 includes fifteenth transistor TR15. The fifteenth transistor TR15 includes a control gate connected to the Q node Q, an input electrode connected to the first clock terminal CT1 and an output electrode connected to an R node R. The R node is connected to a second input terminal OT2 of the nth stage SRCn.

The carry part 240 may further include a capacitor C (not shown) connecting the control gate and the output electrode (e.g., connected between the Q node and the R node). When a high voltage is applied to the Q node Q, the carry part 240 outputs a high voltage VDD of the clock signal CK (received by the first clock terminal CT1) as an n-th carry signal CRn. The n-th carry signal CRn is outputted through the second output terminal OT2 connected to the R node R of the nth stage SRCn.

The first holding part 280 maintains the inactive voltage of the R node R. The first holding part 280 includes eleventh transistor TR11. The eleventh transistor TR11 includes a control gate connected to the N node N, an input terminal connected to the R node R and an output terminal connected to the second voltage terminal VT2 of the nth stage SRCn. The first holding part 280 holds the voltage of the R node R at the second low voltage VSS2 in response to a voltage of the N node N during the remaining time of the frame.

The switching part 270 applies a signal that has a phase identical to that of the clock signal CK received at the first clock terminal CT1, to the N node N during an interval except an output interval of the n-th carry signal CRn. The switching part 270 includes twelfth transistor TR12, a seventh transistor TR7, a thirteenth transistor TR13 and an eighth transistor TR8.

The twelfth transistor TR12 includes a control gate and an input electrode that are connected to the first clock terminal CT1, and an output electrode that is connected to an input electrode of the thirteenth transistor TR13 and the seventh transistor TR7. The seventh transistor TR7 includes a control gate connected to the thirteenth transistor TR13, an input electrode connected to the first clock terminal CT1, and an output electrode connected to an input electrode of the eighth transistor TR8. An output electrode of the seventh transistor TR7 is connected to the N node N. The control gates and input electrodes of the eighth transistor TR8 and an eleventh transistor TR11 are cross-connected.

The thirteenth transistor TR13 includes a control gate connected to the R node R, an input electrode connected to the twelfth transistor TR12 and an output electrode connected to the first voltage terminal VT1. The eighth transistor TR8 includes a control gate connected to the R node R, an input electrode connected to the N node N and an output electrode connected the first voltage terminal VT1.

During an n-th time interval Tn of a frame in which a high voltage is applied to the R node R, the switching part 270 discharges the clock signal CK received through the first clock terminal CT1 into the first low voltage VSS1 received through the first voltage terminal VT1. The eighth and thirteenth transistors TR8 and TR13 are turned ON in response to a high voltage of the R node R. Accordingly, the clock signal CK is discharged into the first low voltage VSS1.

The discharging part 250 includes a first discharging switch 251 and a second discharging switch 252. The discharging part 250 discharges a high voltage of the Q node Q into a second low voltage VSS2 having a level lower than the first low voltage VSS1 in response to at least one of the carry signals outputted from the following stages. In the present exemplary embodiment, the discharging part 250 discharges a high voltage of the Q node Q in response to the (n+1)th and (n+2)th carry signals CRn+1 and CRn+2 (mirroring Gn+1 and Gn+2).

The first discharging circuit 251 includes ninth transistor TR9. The ninth transistor TR9 includes a control gate connected to the second input terminal IN2, an input terminal connected to the Q node Q and an output terminal connected to the first voltage terminal VT1. When the (n+1)th carry signal CRn+1 (mirroring Gn+1) is applied to the second input terminal IN2, the first discharging circuit 251 discharges a voltage of the Q node Q to the first low voltage VSS1 applied to the first voltage terminal VT1.

The second discharging circuit 252 includes sixth transistor TR6. The sixth transistor TR6 includes a control gate connected to a third input terminal IN3, an input terminal connected to the Q node Q and an output terminal connected to the second voltage terminal VT2. When the (n+2)th carry signal CRn+2 (mirroring Gn+2) is applied to the third input terminal IN3, the second discharging circuit 252 discharges a voltage of the Q node Q to the second low voltage VSS2 applied to the second voltage terminal VT2.

Thus, a voltage of the Q node Q has the boosted voltage VBT at an n-th time interval Tn. The voltage of the Q node Q is discharged into the first low voltage VSS1 at an (n+1)th time interval Tn+1, and is discharged into the second low voltage VSS2 at an (n+2)th time interval Tn+2.

The second holding part 290 maintains a voltage of the Q node Q. The second holding part 290 includes tenth transistor TR10. The tenth transistor TR10 includes a control gate connected to the N node N, an input electrode connected to the Q node Q, and an output electrode connected to the second voltage terminal VT2. The second holding part 290 maintains the voltage of the Q node Q at the second low voltage VSS2 in response to a voltage of the N node N during the remaining time interval of the frame.

A gate-source voltage VGS of the first transistor TR1 included in the pull-up part 230 may be defined as the difference between the voltage Qnode_V on node Q and the voltage Onode_V of an output node O (i.e., VGS=Qnode_V−Onode_V). In a conventional gate drive circuit, noise may be generated at a high temperature. For example, the temperature of a display panel may increase (e.g., due to the backlight) from room temperature to about 35 degrees Celsius (° C.) to about 40 degrees Celsius (° C.). When the temperature of the display panel is increased, a drain current of the first transistor TR1 is increased so that its current leakage may be increased.

The increased current leakage is applied to a Q node Q of the following stage through a fifteenth transistor TR15 of the carry part 240, so that a first transistor TR1 of the following stage SRCn+1 is or may be bootstrapped in an interval other than Tn+1 (the time interval in which the following stage SRCn+1 should be driven). Thus, a high temperature noise may be generated.

In the present exemplary embodiment, the gate-source voltage VGS is a negative voltage while the first transistor TR1 is turned OFF, so that current leakage may be decreased. Thus, a noise problem that may be generated by increasing of a drain current at a high temperature may be prevented. Moreover, the number of transistors in the present exemplary embodiment is small in comparison with a conventional gate drive circuit, so that an integrated area of a gate drive circuit (e.g., its area in a semiconductor substrate) may be decreased.

Figure 5:
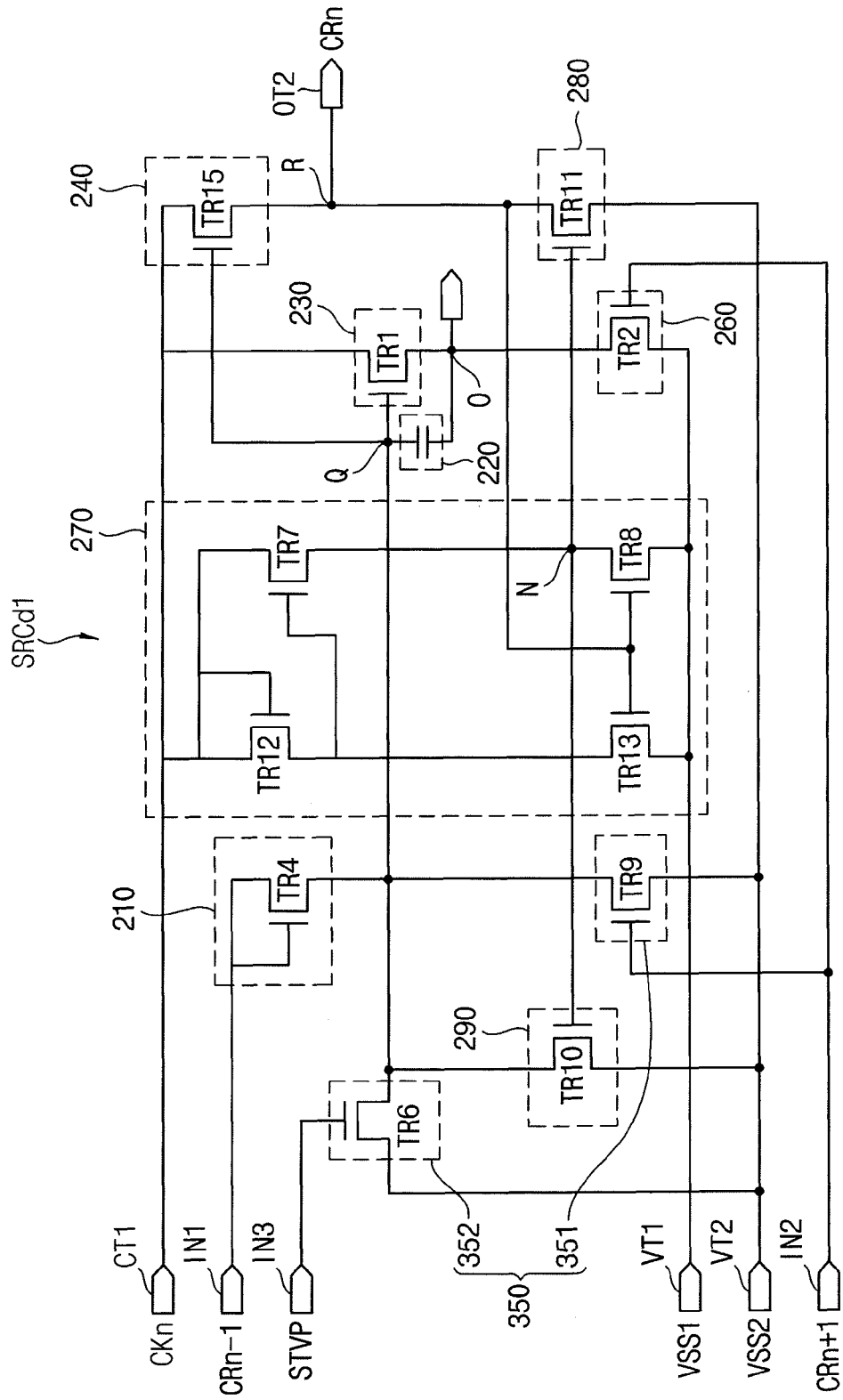
FIG. 5 is a circuit diagram of a first dummy stage SRCd1 of the gate drive circuit 200-1 of FIG. 2.
Figure 6:
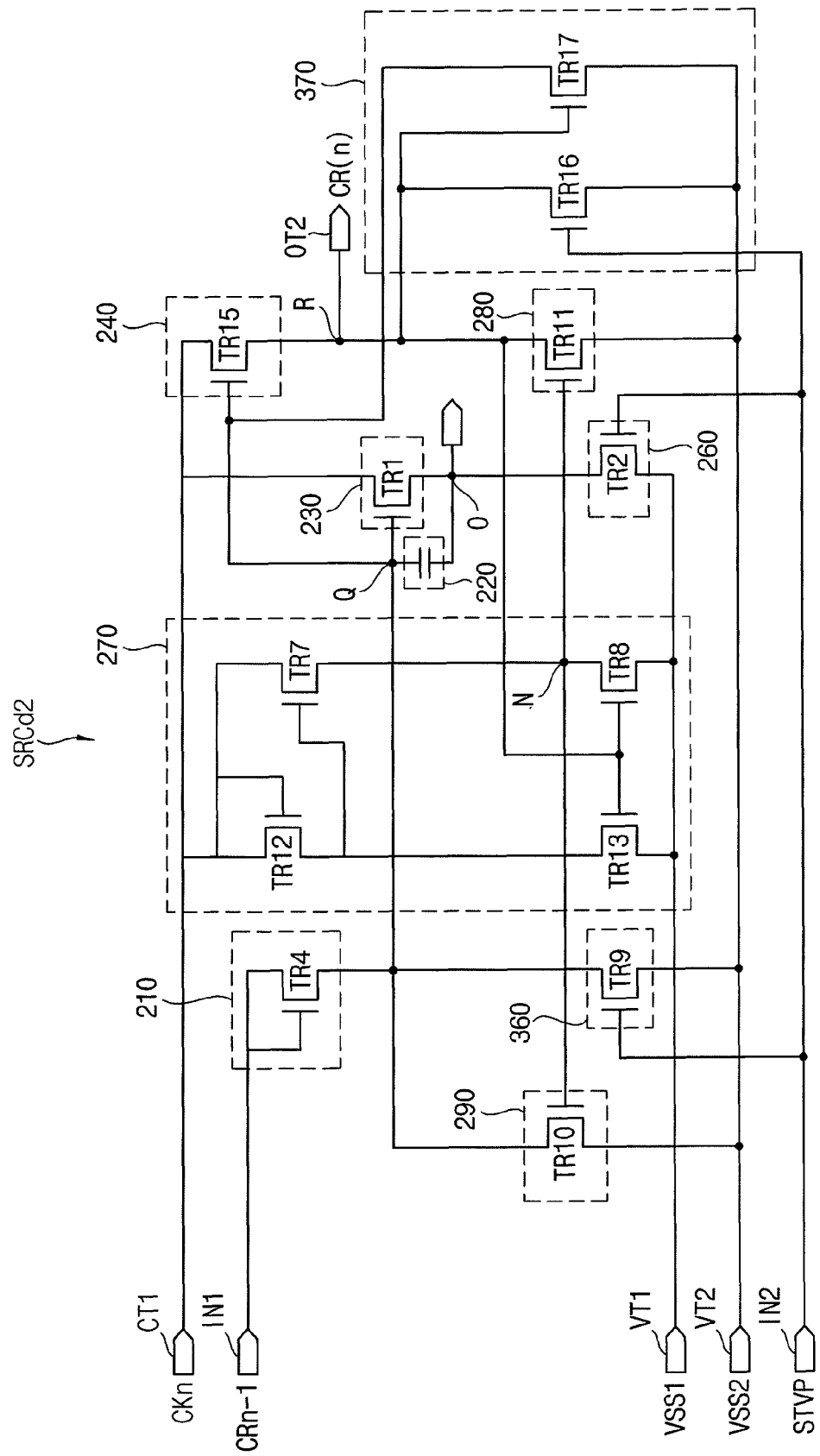
FIG. 6 is a circuit diagram of a second dummy stage SRCd2 of the gate drive circuit 200-1 of FIG. 2.

FIG. 5 is a circuit diagram of a first dummy stage SRCd1 of the gate drive circuit 200-1 of FIG. 2. FIG. 6 is a circuit diagram of a second dummy stage SRCd2 of the gate drive circuit 200-1 of FIG. 2.

Referring to FIG. 5, the first dummy stage SRCd1 is substantially the same as the n-th stage SRCn shown in FIG. 3 except for the discharging part 350. The elements shown in FIG. 5 that have been labeled the same have the same characteristics as elements of the exemplary embodiments of the n-th stage SRCn shown in FIG. 3, and any repetitive detailed description thereof will hereinafter be omitted or simplified.

The discharging part 350 of the first dummy stage SRCd1 discharges a high voltage of the Q node Q, to a second low voltage VSS2 lower than the first low voltage VSS1, in response to the (n+1)th carry signal CRn+1 (mirroring Gn+1) (or the vertical start signal STV). The discharging part 350 includes a first discharging circuit 351 and a second discharging circuit 352.

The first discharging circuit 351 includes ninth transistor TR9. The ninth transistor TR9 includes a control gate connected to the second input terminal IN2, an input terminal connected to the Q node Q and an output terminal connected to the second voltage terminal VT2. When the (n+1)th carry signal CRn+1 (mirroring Gn+1) is applied to the second input terminal IN2, the first discharging circuit 351 discharges the voltage of the Q node Q to the second low voltage VSS2 applied to the second voltage terminal VT2.

The second discharging circuit 352 includes sixth transistor TR6. The sixth transistor TR6 includes a control gate connected to a third input terminal IN3, an input terminal connected to the Q node Q and an output terminal connected to the second voltage terminal VT2. When the vertical start signal STV is applied to the third input terminal IN3, the second discharging circuit 352 discharges the voltage of the Q node Q to the second low voltage VSS2 applied to the second voltage terminal VT2.

The vertical start signal STV is inputted to the third input terminal IN3 of the first dummy stage SRCd1 instead of the (n+2)th carry signal CRn+2 (mirroring Gn+2) from the (n+2) th stage SRCn+2.

Referring to FIG. 6, the second dummy stage SRCd2 is substantially the same as the n-th stage SRCn shown in FIG. 3 except for the discharging part 360 and the additional reset part 370. The elements shown in FIG. 6 that have been labeled the same have the same characteristics as elements of the exemplary embodiments of the n-th stage SRCn shown in FIG. 3, and any repetitive detailed description thereof will hereinafter be omitted or simplified.

The discharging part 360 discharges a high voltage of the Q node Q, to a second low voltage VSS2 lower than the first low voltage VSS1, in response to the vertical start signal STV received at the second input terminal IN2 of the second dummy stage SRCd2.

The discharging part 360 includes ninth transistor TR9. The ninth transistor TR9 includes a control gate connected to the second input terminal IN2, and input electrode connected to the Q node Q, and an output electrode connected to the second voltage terminal VT2. When the vertical start signal STV is received through the second input terminal IN2, the discharging part 360 discharges a voltage of the Q node Q to the second low voltage VSS2 applied to the second voltage terminal VT2.

The vertical start signal STV is inputted to the second input terminal IN2 of the second dummy stage SRCd2 instead of the (n+1)th carry signal CRn+1 (mirroring Gn+1) from the (n+1)th stage SRCn+1. The vertical start signal STV applied to the second input terminal IN2 of the second dummy stage SRCd2 may be a vertical start signal corresponding to the following frame. The second dummy stage SRCd2 does not receive the (n+2)th carry signal CRn+2 (mirroring Gn+2), and does not output a gate signal.

The reset part 370 resets the R node R and the Q node Q. The reset part 370 includes sixteenth transistor TR16 and a seventeenth transistor TR17.

The sixteenth transistor TR16 includes a control gate connected to the second input terminal IN2, an input electrode connected to the R node R, and an output electrode connected to the second voltage terminal VT2. The sixteenth transistor TR16 pulls down the voltage of the R node R to the second low voltage VSS2 in response to the vertical start signal STV applied to the second input terminal IN2.

The seventeenth transistor TR17 includes a control gate connected to the R node R, an input electrode connected to the Q node Q, and an output electrode connected to the second voltage terminal VT2. The seventeenth transistor TR17 pulls down the voltage of the Q node Q to the second low voltage VSS2 in response to a voltage of the R node R.

Figure 7:
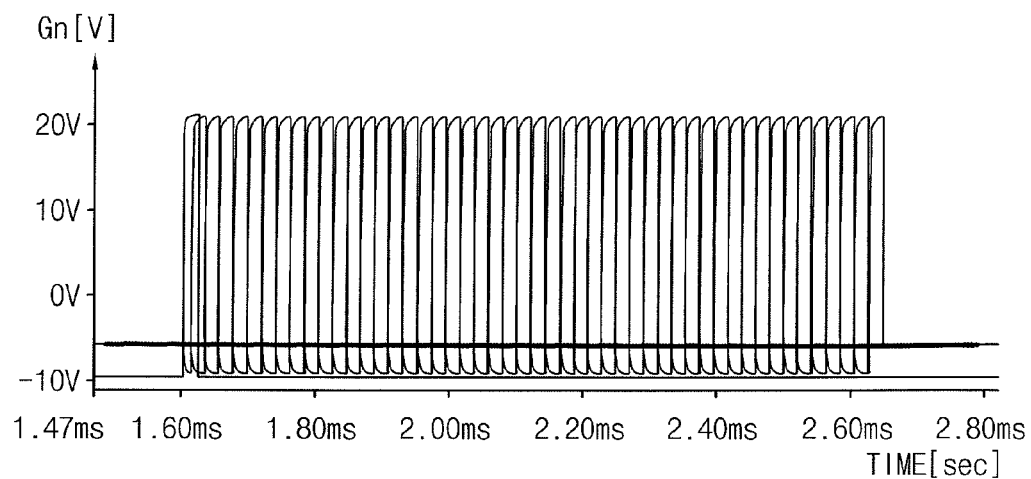
FIG. 7 is a waveform diagram illustrating a simulation of an output Gn of the gate drive circuit 200-1 of FIG. 2 operating at a high temperature condition.
Figure 8:
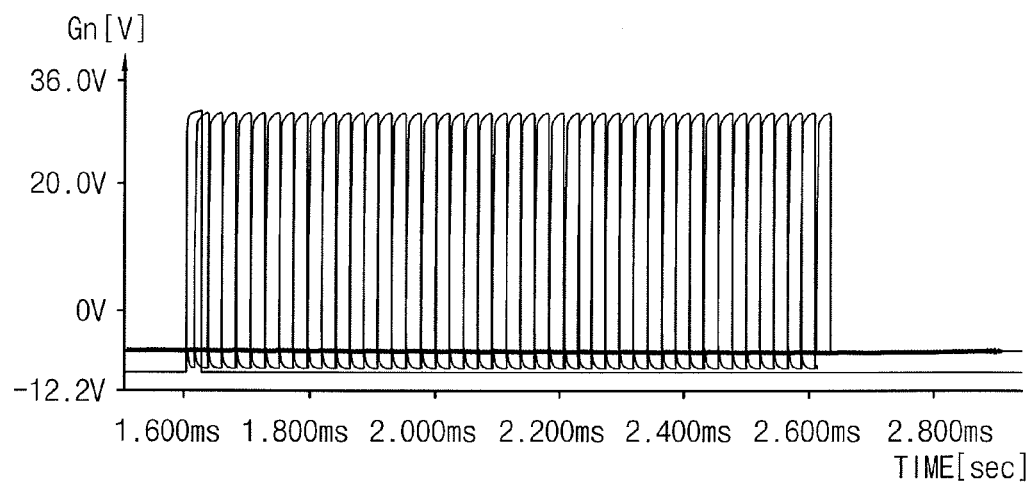
FIG. 8 is a waveform diagram illustrating a simulation of an output Gn of the gate drive circuit 200-1 of FIG. 2 operating at a low temperature condition.

FIG. 7 is a waveform diagram illustrating a simulation of an output Gn of the gate drive circuit 200-1 of FIG. 2 operating at a high temperature condition. FIG. 8 is a waveform diagram illustrating a simulation of an output Gn of the gate drive circuit 200-1 of FIG. 2 operating at a low temperature condition.

In the waveform diagram of FIG. 7, measured gate signals outputted from each of the m stages at a temperature of about 80 degrees Celsius, are plotted over time. In the waveform diagram of FIG. 8 measured gate signals outputted from each of the m stages at a temperature of about 40 degrees Celsius are plotted over time.

Referring to FIGS. 7 and 8, since outputs of the gate signals are uniform at both temperatures, it is recognized that the gate drive circuit 200-1 of the present exemplary embodiment is generates gate line outputs Gn in a reliable manner even though the gate drive circuit 200-1 of the present exemplary embodiment has a relatively small number of transistors (e.g., smaller than the number or transistors in each stage of a conventional gate drive circuit).

Figure 9:
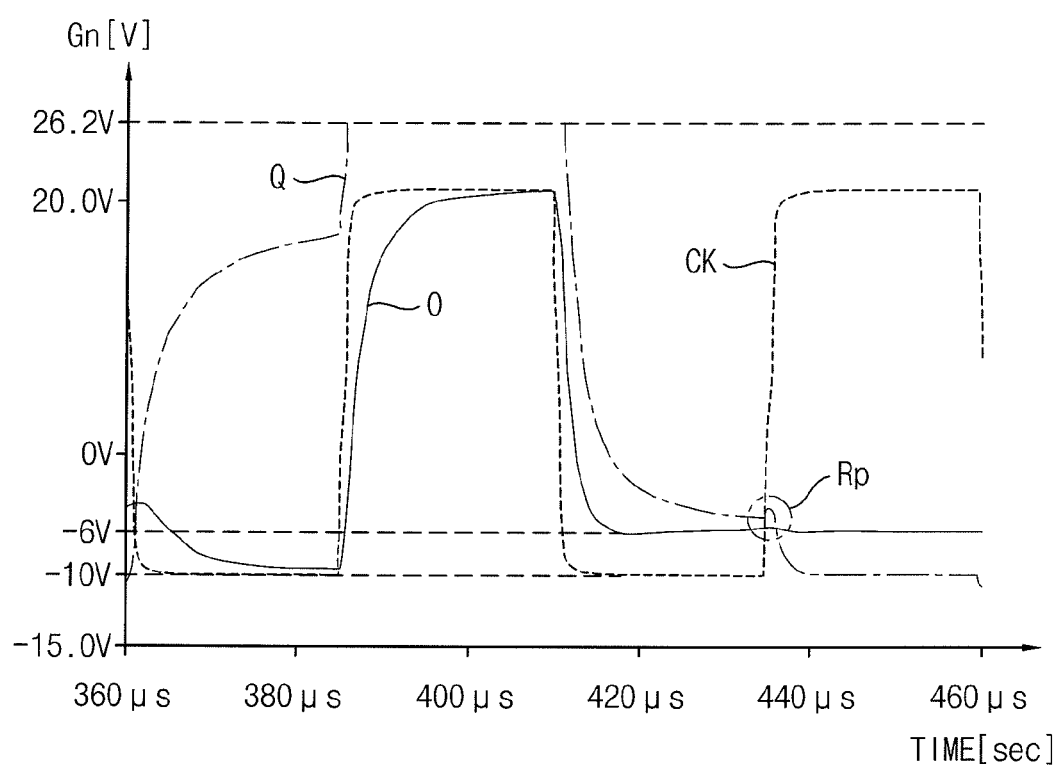
FIG. 9 is a waveform diagram illustrating a simulation of a voltage of a Q node and the output voltage Gn of the gate drive circuit 200-1 of FIG. 2 on a microsecond timescale.

FIG. 9 is a waveform diagram illustrating a simulation of a voltage of a Q node and the output voltage Gn of the gate drive circuit 200-1 of FIG. 2 on a microsecond timescale.

FIG. 9 shows the waveform of signals measured at the Q node Q and of the output voltage at node O when the gate-source voltage VGS of the first transistor TR1 is designed to be about −4 V. In order to design the gate-source voltage VGS to be about −4 V, the low voltage of the Q node should be about −10 V and the low voltage of the output node O should be about −6 V. Thus, the gate-source voltage VGS may be about −4 V (i.e., −10V−(−6V)=−4V).

According to the present exemplary embodiment, it is recognized that a signal of the output node O has a high voltage during 1H interval, (wherein 'H' is a horizontal period) and has the first low voltage VSS1 (i.e., −6V) during the remaining time interval. In addition, it is recognized that a signal of the Q node Q is pulled down to the first low voltage VSS1 (i.e., −6V) in a time interval following after a boosted voltage is outputted in the 1H interval in which the signal of the output voltage at node O has a high voltage, and is maintained at the second low voltage VSS2 (i.e., −10V) in the remaining time interval.

Moreover, it is recognized that the signal of the Q node Q has a ripple component Rp after the 1H interval and the maximum level of the ripple component Rp is about −2 V (see Rp circled in FIG. 9). The ripple component Rp is the gate-source voltage VGS of the first transistor TR1 while the first transistor TR1 is turned OFF.

As a result, a drain current by the ripple component Rp is small in comparison with a case that a gate-source voltage VGS of the first transistor TR1 is about 0 V. Thus, a high temperature noise of a gate drive circuit may be prevented because the gate-source voltage VGS of the first transistor TR1 is a negative voltage.

Moreover, according to the present exemplary embodiment, the falling time of the output voltage was about 2.403 microseconds. Thus, it is recognized that the falling time of the present exemplary embodiment is substantially equal to that of a conventional gate drive circuit.

Figure 10:
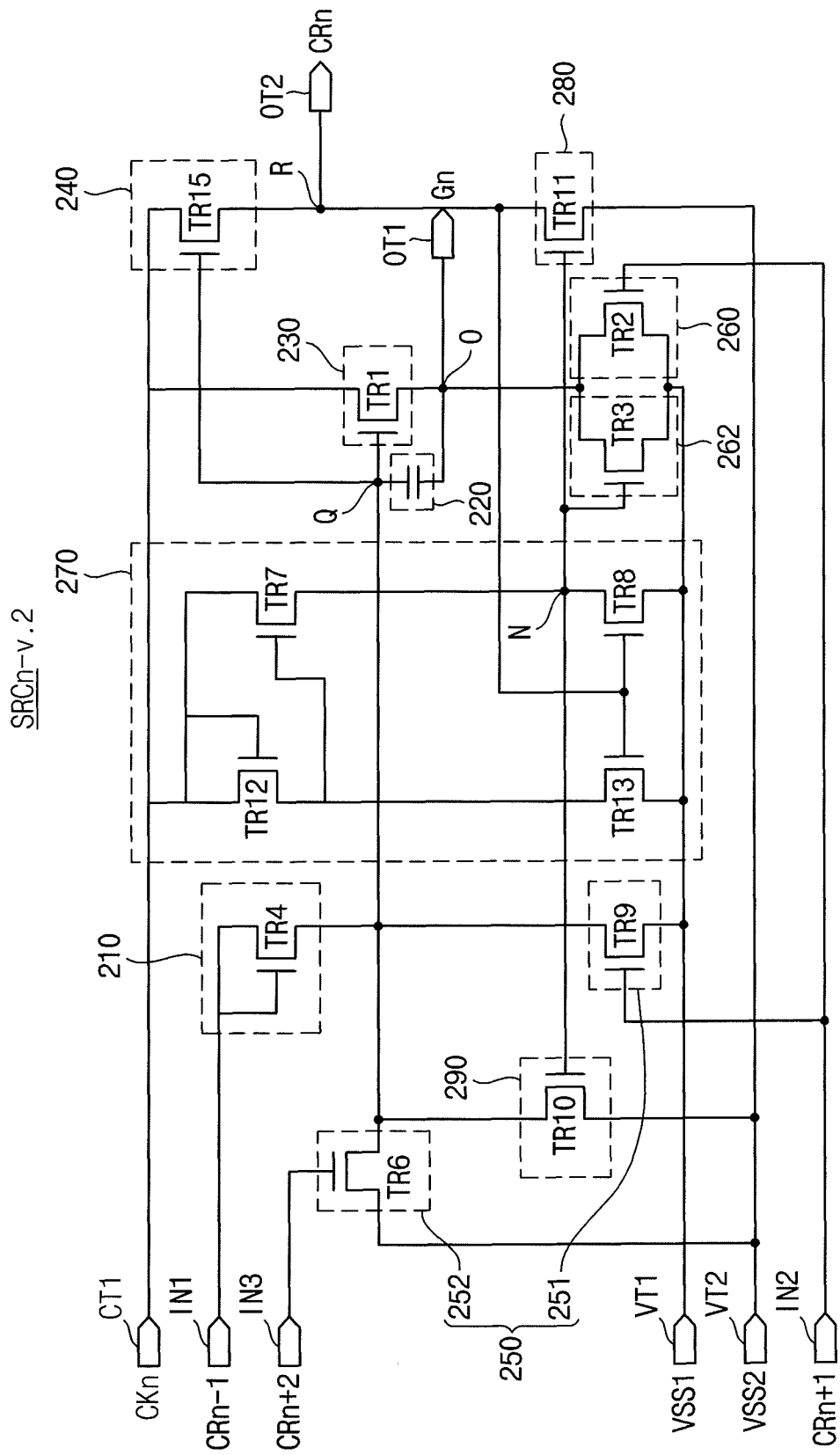
FIG. 10 is a circuit diagram of the n-th stage SRCn (version 2) of the gate drive circuit 200-1 of FIG. 2 according to another exemplary embodiment of the present invention.

FIG. 10 is a circuit diagram of the n-th stage SRCn (SRCn version 2) of a gate drive circuit 200-1 of FIG. 2 according to another exemplary embodiment of the present invention.

Referring to FIG. 10, an n-th stage SRCn according to the present exemplary embodiment is substantially the same as the n-th stage SRCn shown in FIG. 3 except for an additional third holding part 262. The elements shown in FIG. 10 that have been labeled the same have the same characteristics as the elements of exemplary embodiments of the n-th stage SRCn shown in FIG. 3, and any repetitive detailed description thereof will hereinafter be omitted or simplified.

The third holding part 262 maintains the voltage of the output node O. The third holding part 262 includes a third transistor TR3. The third transistor TR3 includes a control gate connected to the N node N, an input electrode connected to the output node O, and an output electrode connected to the first voltage terminal VT1. The third holding part 262 maintains the voltage of the output node O at the first low voltage VSS1 applied to the first voltage terminal VT1 in response to the voltage of the N node N during the remaining time interval of the frame.

In the present exemplary embodiment, since the n-th stage SRCn further includes the third holding part 262, the voltage of the output node O which is pulled down to the first low voltage VSS1 by the pull-down part 260 may be stably maintained.

Figure 11:
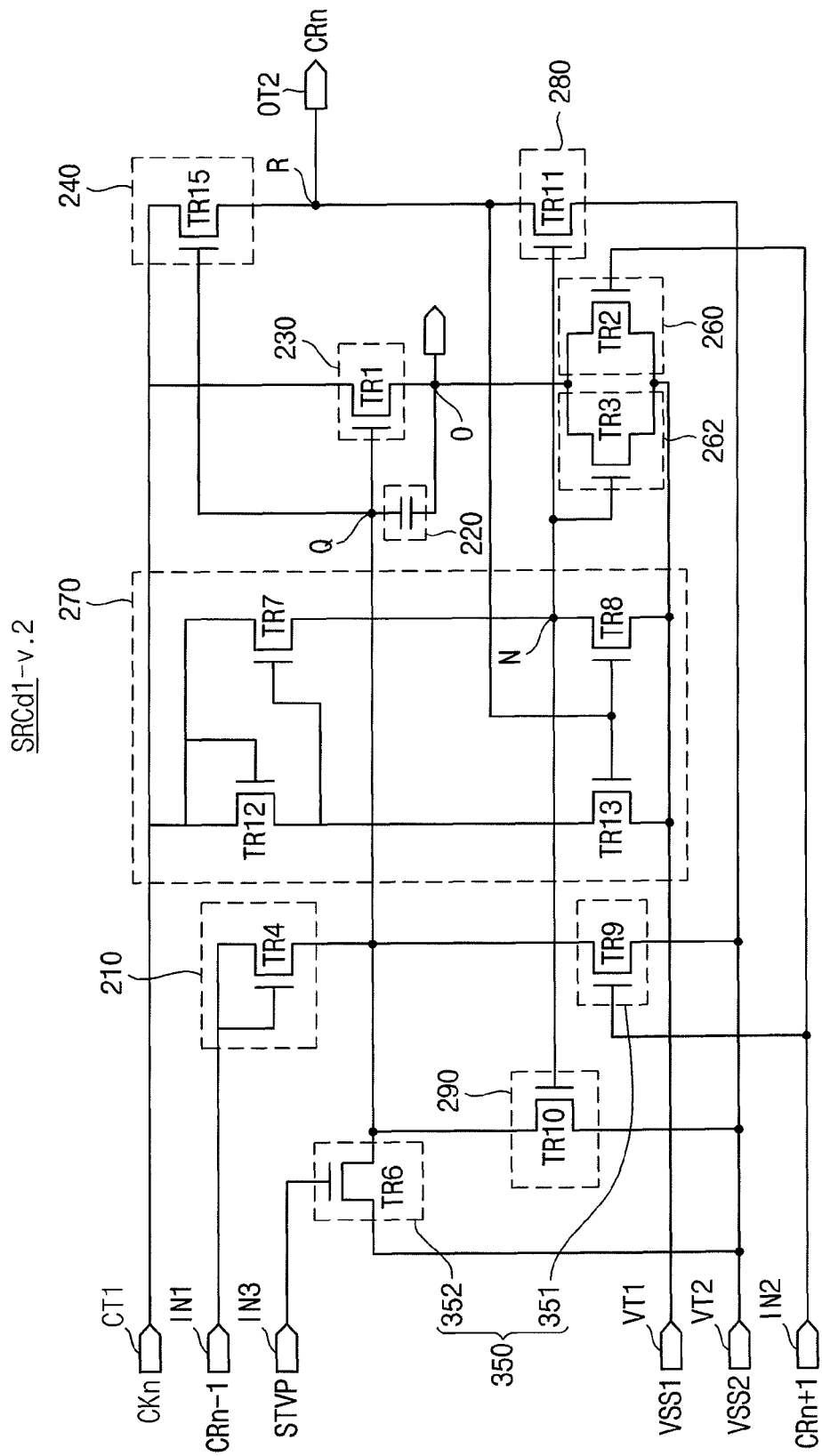
FIG. 11 is a circuit diagram of a first dummy stage SRCd1 for the SRCn (version 2) in FIG. 10.
Figure 12:
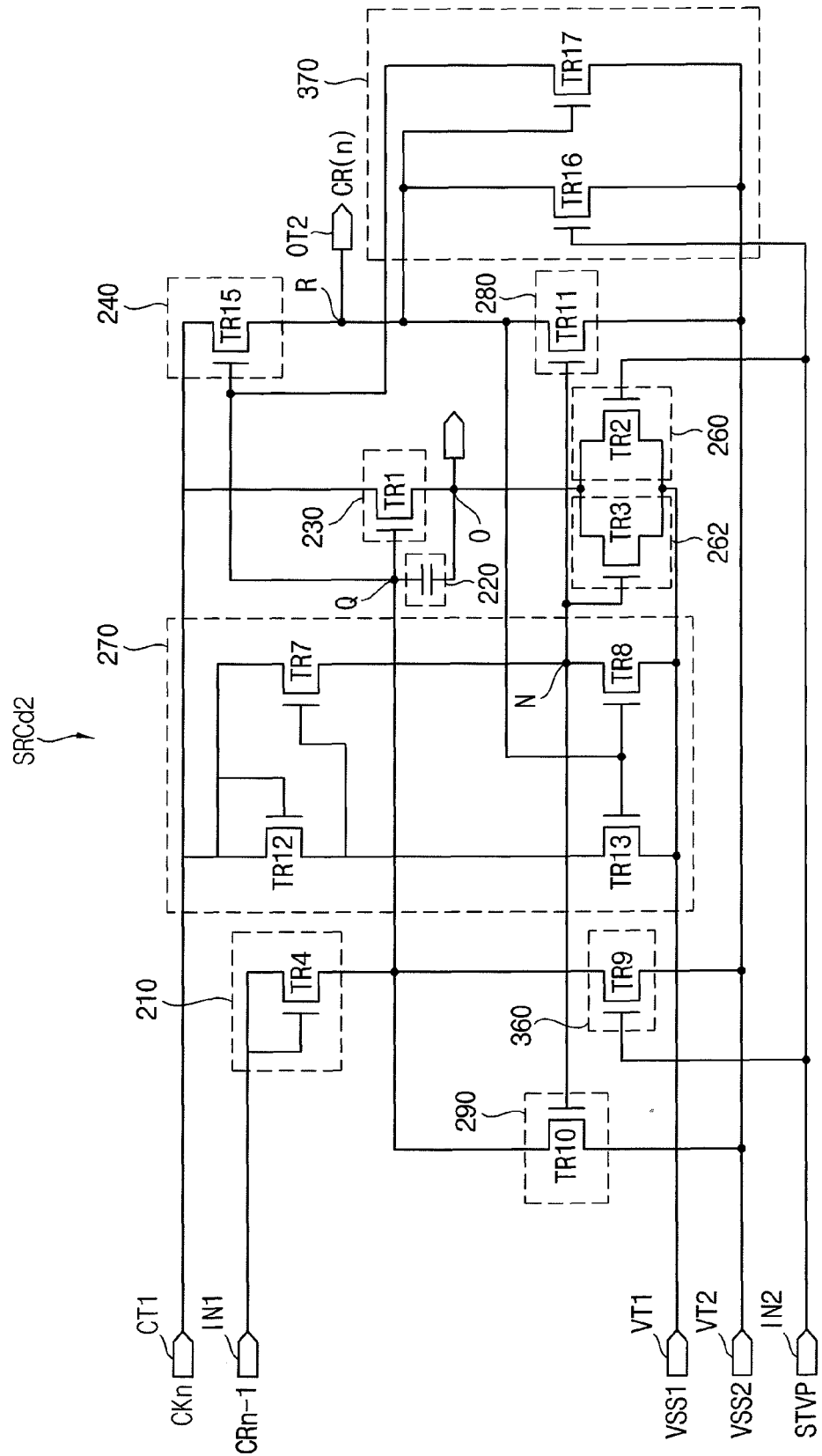
FIG. 12 is a circuit diagram of a second dummy stage SRCd2 for the SRCn (version 2) in FIG. 10.

FIG. 11 is a circuit diagram of a first dummy stage SRCd1 for the SRCn version 2 in FIG. 10. FIG. 12 is a circuit diagram of a second dummy stage SRCd2 for the SRCn version 2 shown in FIG. 10.

Referring to FIG. 11, the first dummy stage SRCd1 version 2 is substantially the same as the first dummy stage SRCd1 (version 1) shown in FIG. 5 except that the first dummy stage SRCd1 version 2 further includes a third holding part 262. Moreover, referring to FIG. 12, the second dummy stage SRCd2 version 2 is substantially the same as the second dummy stage SRCd2 version 1 shown in FIG. 6 except that the second dummy stage SRCd2 version 2 further includes a third holding part 262.

Thus, the same reference numerals are used herein to refer to the same or like parts as those described in the n-th stage SRCn of FIG. 5 and the second dummy stage SRCd2 of FIG. 6 and any further explanation concerning the above elements will be omitted.

Figure 13:
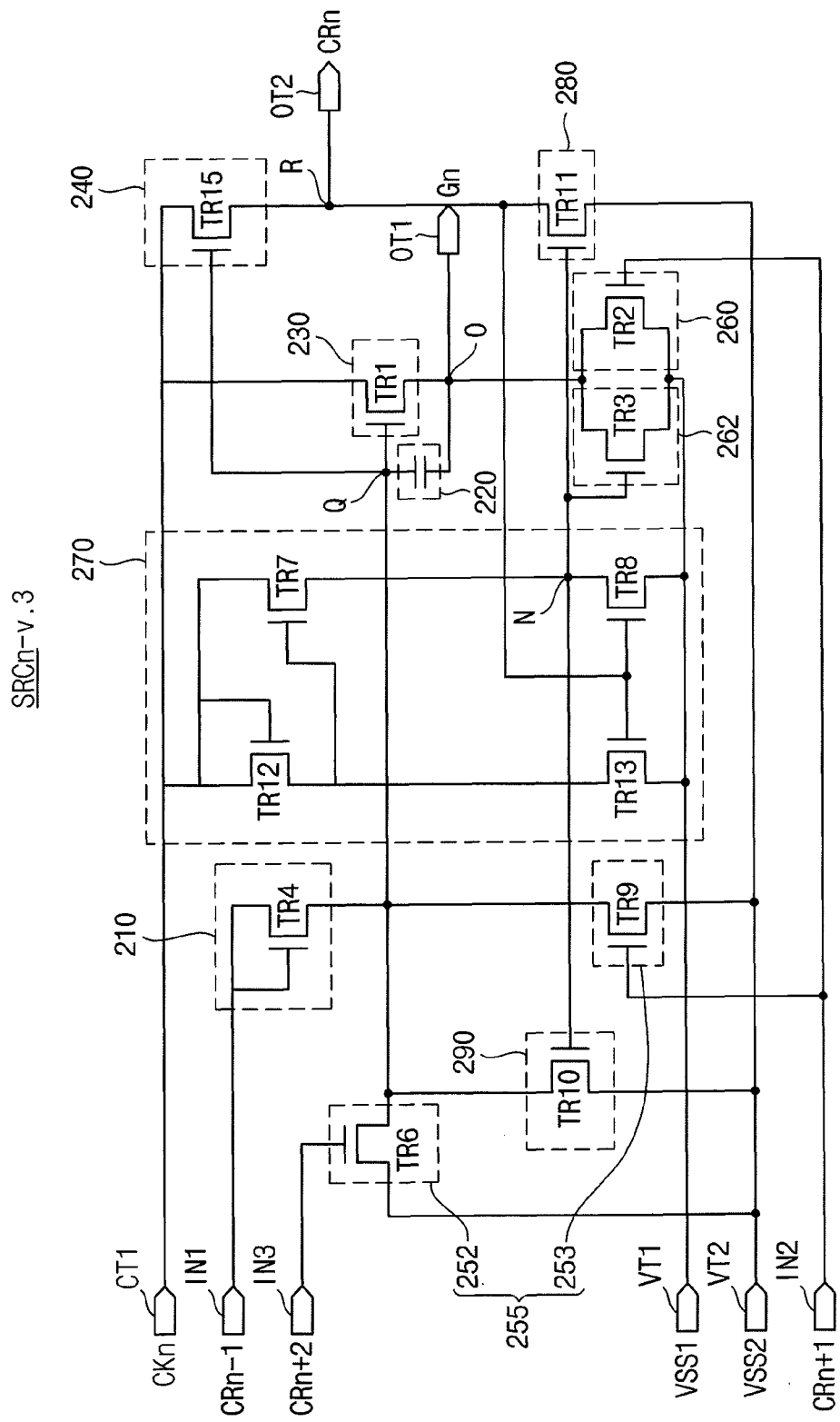
FIG. 13 is a circuit diagram of the n-th a stage SRCn (version 3) of the gate drive circuit 200-1 of FIG. 2 according to still another exemplary embodiment of the present invention.

FIG. 13 is a circuit diagram of the n-th stage SRCn (SRCn version 3) of the gate drive circuit 200-1 of FIG. 2 according to still another exemplary embodiment of the present invention.

Referring to FIG. 13, an n-th stage SRCn version 3 according to the present exemplary embodiment is substantially the same as the n-th stage SRCn version 2 shown in FIG. 10 except for the discharging part 255. The elements shown in FIG. 13 that have been labeled the same have the same characteristics as the elements of exemplary embodiments of the n-th stage SRCn version 2 shown in FIG. 10, and any repetitive detailed description thereof will hereinafter be omitted or simplified.

The discharging part 255 discharges a high voltage of the Q node Q, to a second low voltage VSS2 having a lower level than the first low voltage VSS1, in response to at least one of the carry signals (CRn+1 and CRn+2) outputted from following stages SRCn+1 and SRCn+2. In the present exemplary embodiment, the discharging part 255 discharges a high voltage of the Q node Q in response to the (n+1)th carry signal CRn+1 (mirroring Gn+1) and the (n+2)th carry signal CRn+2 (mirroring Gn+2).

The discharging part 255 includes a first discharging part 253 and a second discharging circuit 252.

The first discharging part 253 includes ninth transistor TR9. The ninth transistor TR9 includes a control gate connected to the second input terminal IN2, an input terminal connected to the Q node Q and an output terminal connected to the second voltage terminal VT2. When the (n+1)th carry signal CRn+1 (mirroring Gn+1) is applied to the second input terminal IN2, the first discharging part 253 discharges the voltage of the Q node Q to the second low voltage VSS2 applied to the second voltage terminal VT2.

The second discharging circuit 252 includes sixth transistor TR6. The sixth transistor TR6 includes a control gate connected to the third input terminal IN3, an input terminal connected to the Q node Q and an output terminal connected to the second voltage terminal VT2. When the (n+2)th carry signal CRn+1 (mirroring Gn+2) is applied to the third input terminal IN3, the second discharging circuit 252 discharges the voltage of the Q node Q to the second low voltage VSS2 applied to the second voltage terminal VT2.

In the present exemplary embodiment, a voltage of the Q node Q has the boosted voltage VBT in an n-th time interval Tn of the current frame and is discharged into the second low voltage VSS2 in an (n+1)th time interval Tn+1, so that a discharging time may be reduced.

Figure 14:
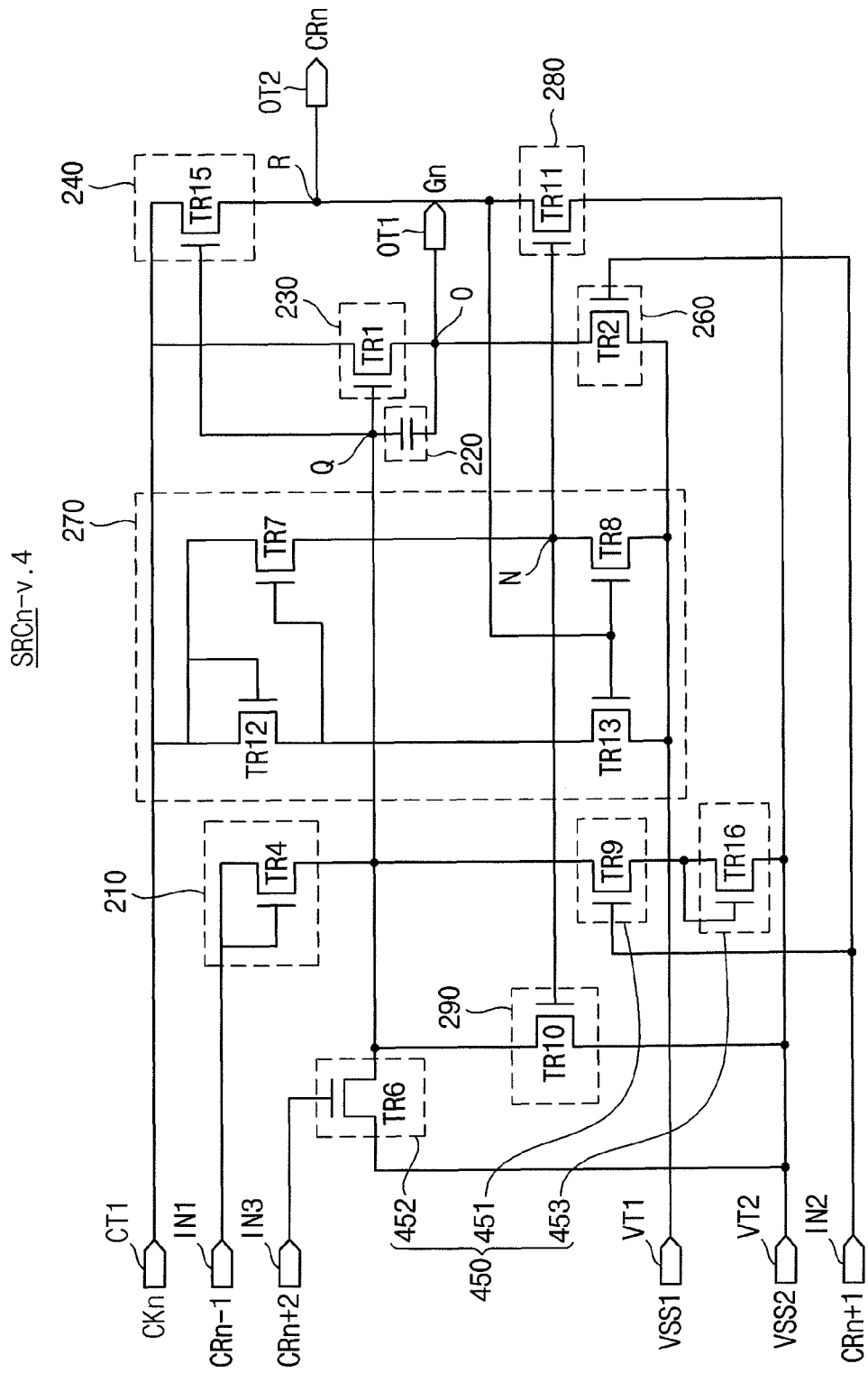
FIG. 14 is a circuit diagram of the n-th stage SRCn (version 4) of the gate drive circuit 200-1 of FIG. 2 according to still another exemplary embodiment of the present invention.
Figure 15:
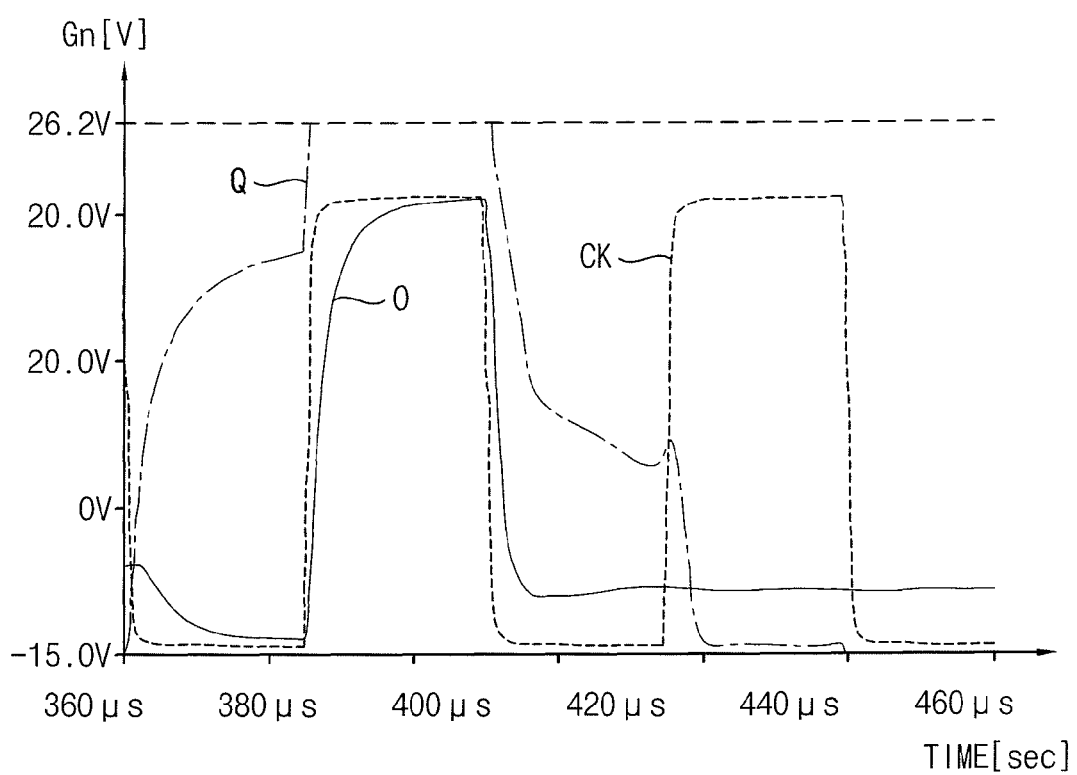
FIG. 15 is a waveform diagram illustrating a simulation of a voltage of a Q node and an output voltage Gn of the stage SRCn version 4 of FIG. 14 in the gate drive circuit 200-1 of FIG. 2.

FIG. 14 is a circuit diagram of the n-th a stage SRCn (SRCn version 4) of a gate drive circuit according to still another exemplary embodiment of the present invention. FIG. 15 is a waveform diagram illustrating a simulation of a voltage of a Q node and an output voltage Gn of the stage SRCn version 4 of FIG. 14 in the gate drive circuit 200-1 of FIG. 2.

Referring to FIG. 14, an n-th stage SRCn (version 4) according to the present exemplary embodiment is substantially the same as the n-th stage SRCn (version 1) shown in FIG. 3 except for a discharging part 450. The elements shown in FIG. 14 that have been labeled the same have the same characteristics as the elements of exemplary embodiments of the n-th stage SRCn shown in FIG. 3, and any repetitive detailed description thereof will hereinafter be omitted or simplified.

The discharging part 450 includes a first discharging circuit 451, a sub-discharging circuit 453 and a second discharging circuit 452.

The first discharging circuit 451 includes ninth transistor TR9. The ninth transistor TR9 includes a control gate connected to the second input terminal IN2, an input electrode connected to the Q node Q, and an output electrode connected to the sub-discharging circuit 453. When the (n+1)th carry signal CRn+1 (mirroring Gn+1) is applied to the second input terminal IN2, the first discharging circuit 451 discharges the voltage of the Q node Q to the second low voltage VSS2 applied to the second voltage terminal VT2 through the sub-discharging circuit 453.

The sub-discharging circuit 453 includes a sixteenth transistor TR16. The sixteenth transistor TR16 includes a control gate and an input electrode that are connected to an output electrode of the first discharging circuit 451, and an output electrode connected to the second voltage terminal VT2. The sub-discharging circuit 453 discharges a voltage of the Q node Q to the second low voltage VSS2.

The second discharging circuit 452 includes sixth transistor TR6. The sixth transistor TR6 includes a control gate connected to a third input terminal IN3, an input electrode connected to the Q node Q, and an output electrode connected to the second voltage terminal VT2. When the (n+2)th carry signal CRn+2 mirroring Gn+2 is applied to the third input terminal IN3, the second discharging circuit 452 discharges the voltage of the Q node Q to the second low voltage VSS2 applied to the second voltage terminal VT2.

In the present exemplary embodiment, since the n-th stage SRCn further includes the resistive sub-discharging circuit 453, discharging of the Q node Q is delayed so that the falling time of an output voltage may be shortened.

In the waveform diagram of FIG. 15 shows measured gate signals Gn outputted from the n-th stage SRCn (version 4) of FIG. 14 driven for about 500 hours at a temperature of about 80 degrees Celsius. It is recognized that the falling time of the output voltage Gn shown in FIG. 15 leads a falling time of an output voltage Gn of FIG. 3. Thus, the driving reliability may be secured even though the gate drive circuit including state SRCn (version 4) is driven for a long time.

Figure 16:
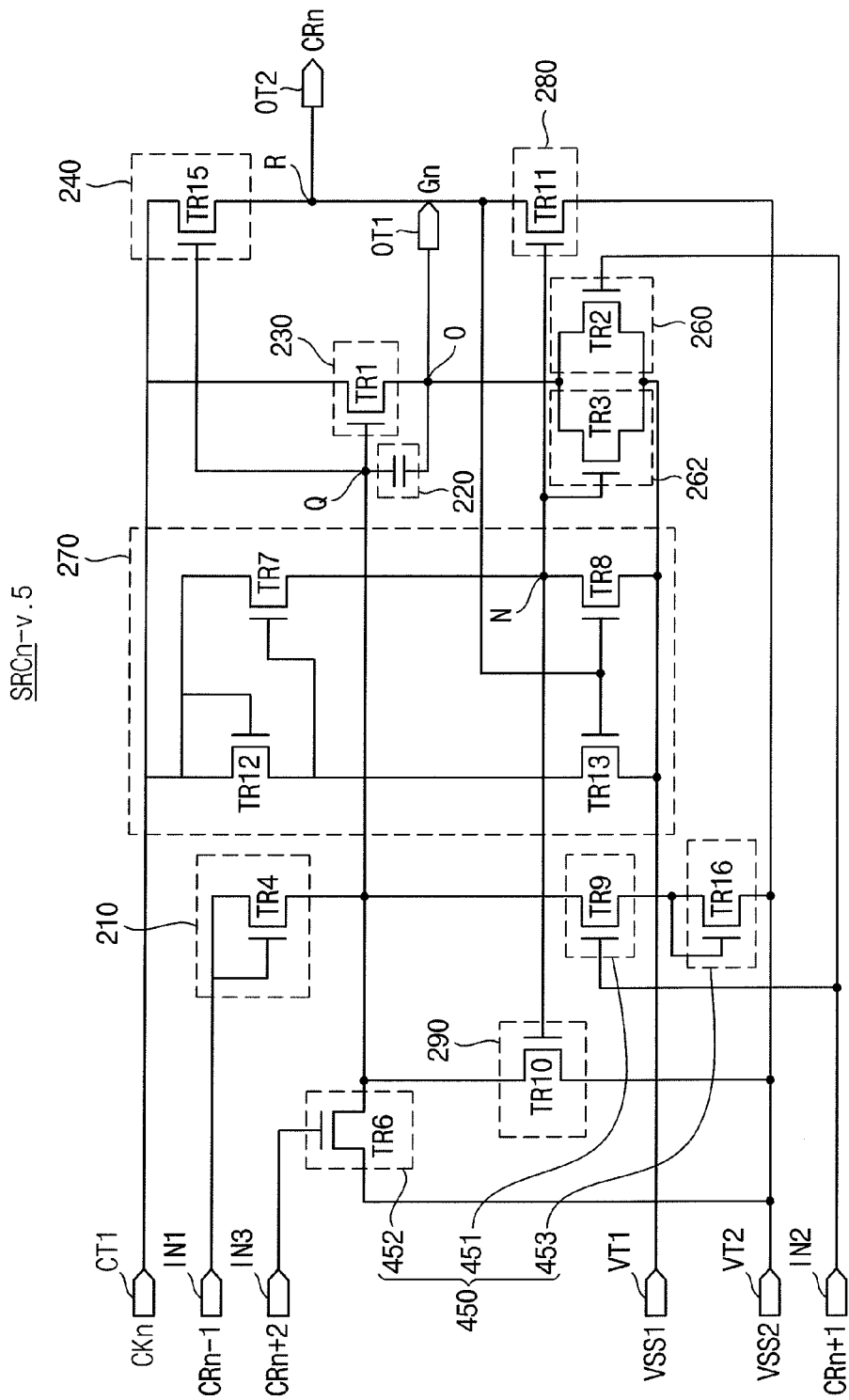
FIG. 16 is a circuit diagram of the n-th stage SRCn (version 5) of the gate drive circuit of FIG. 2 according to still another exemplary embodiment of the present invention.

FIG. 16 is a circuit diagram of the n-th stage SRCn (SRCn version 5) of a gate drive circuit according to still another exemplary embodiment of the present invention.

Referring to FIG. 16, an n-th stage SRCn (version 5) according to the present exemplary embodiment is substantially the same as the n-th stage SRCn (version 4) shown in FIG. 14 except for a third holding part 262. The elements shown in FIG. 16 that have been labeled the same have the same characteristics as the elements of the exemplary embodiments of the n-th stage SRCn shown in FIG. 14, and any repetitive detailed description thereof will hereinafter be omitted or simplified.

The third holding part 262 maintains the voltage of the output node O. The third holding part 262 includes third transistor TR3. The third transistor TR3 includes a control gate connected to the N node N, an input electrode connected to the output node O and an output electrode connected to the first voltage terminal VT1. The third holding part 262 maintains the voltage of the output node O to the first low voltage VSS1 applied to the first voltage terminal VT1 in response to a voltage of the N node N during a the remaining time of the frame.

In the present exemplary embodiment, since the n-th stage SRCn (version 5) further includes the third holding part 262, the voltage of the output node O which is pulled down to the first low voltage VSS1 by the pull-down part 260 may be maintained stable.

Figure 17:
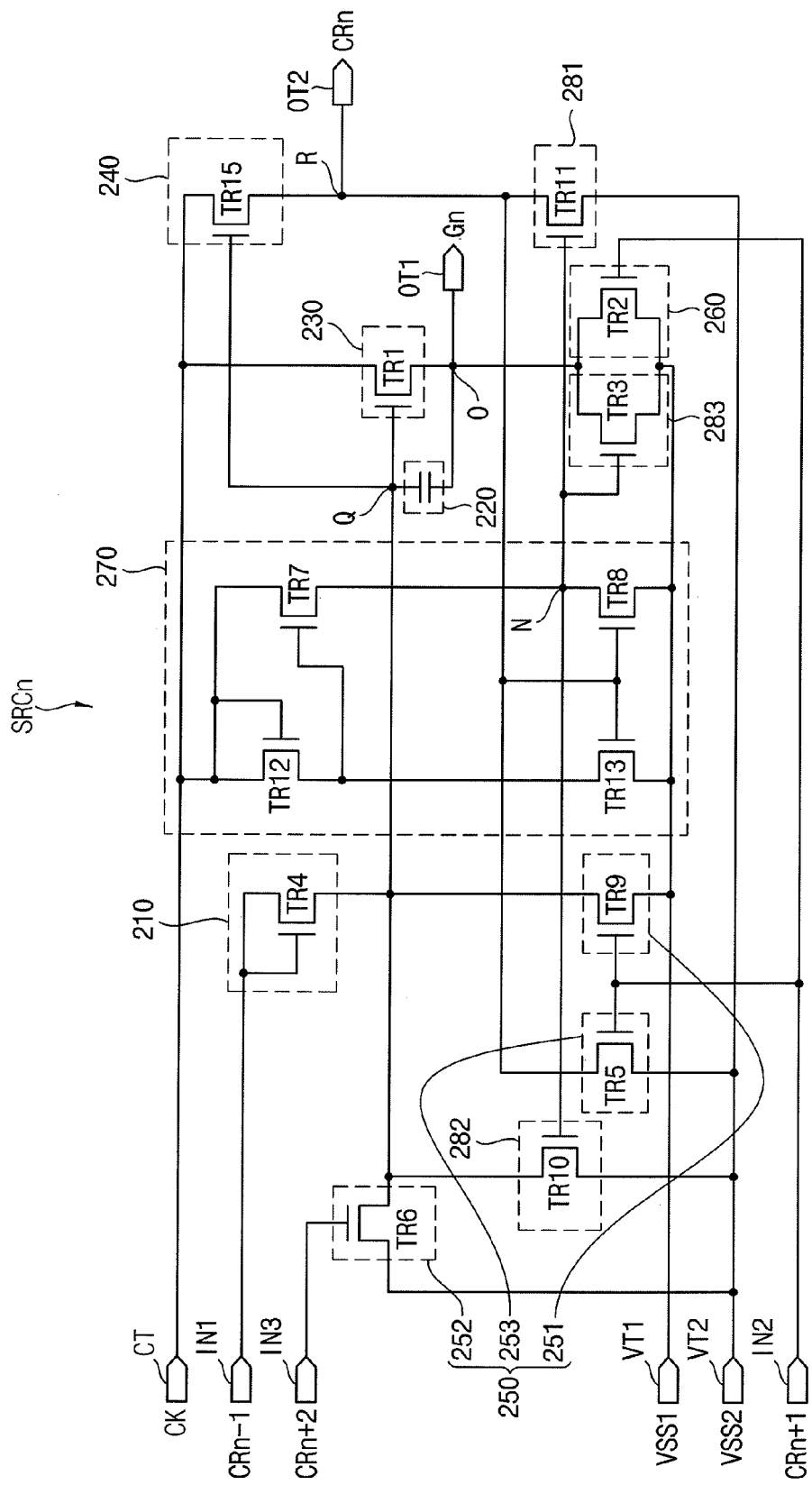
FIG. 17 is a circuit diagram of the n-th stage SRCn (version 6) of the gate drive circuit 200-1 of FIG. 2 according to still another exemplary embodiment of the present invention.
Figure 18:
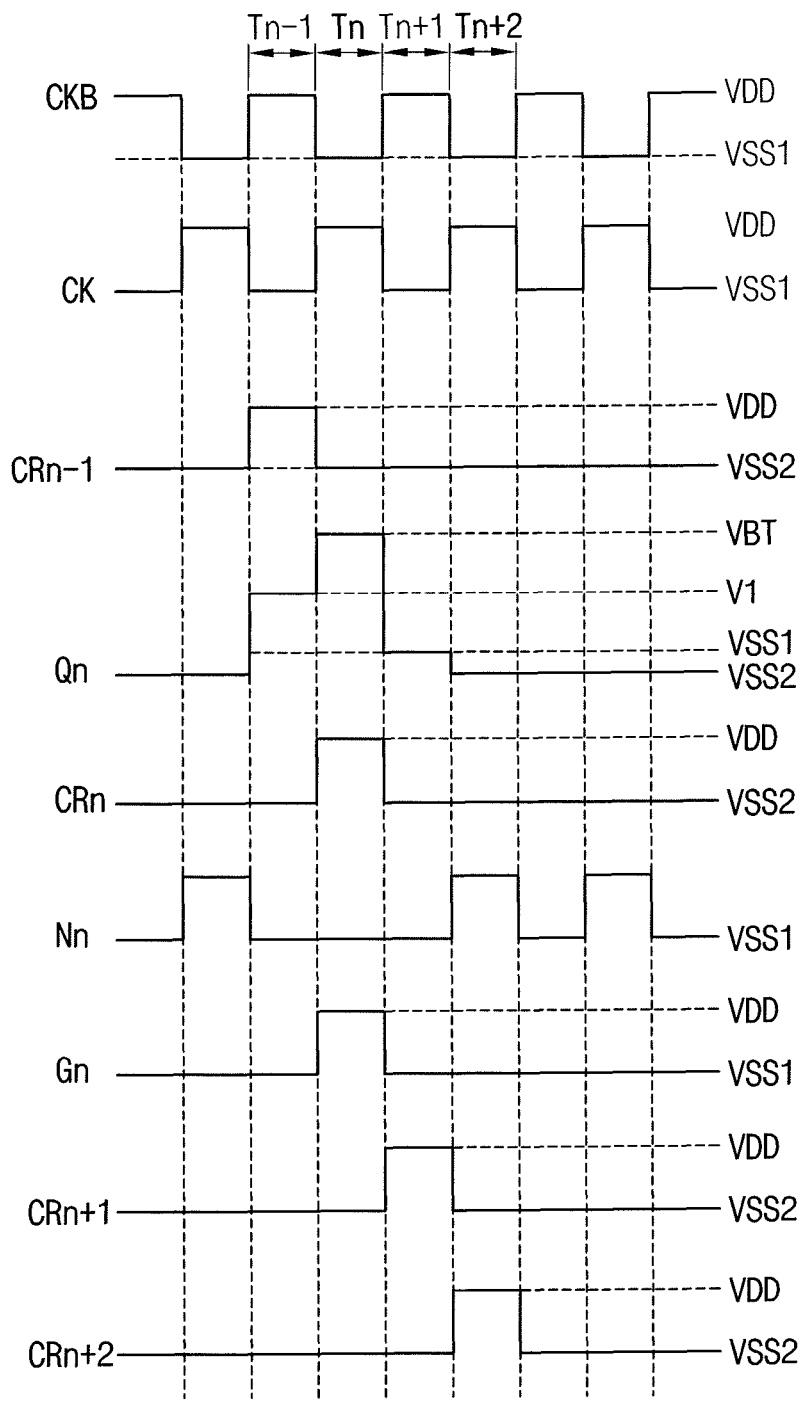
FIG. 18 is a waveform diagram showing timing and voltages of signals of the n-th stage SRCn (version 7) of FIG. 17.

FIG. 17 is a circuit diagram of the n-th stage SRCn (version 6) of the gate drive circuit of FIG. 2 according to still another exemplary embodiment of the present invention. FIG. 18 is a waveform diagram showing timing and voltages of signals of the n-th stage SRCn (version 6) of FIG. 17.

Referring to FIGS. 17 and 18, an n-th stage SRCn includes a buffer part 210, a charging part 220, a pull-up part 230, a carry part 240, a discharging part 250, a pull-down part 260, a switching part 270, a first maintaining part 281, a second maintaining part 282 and a third maintaining part 283.

The buffer part 210 delivers the (n−1)th carry signal CRn−1 to the pull-up part 230. The buffer part 210 includes a fourth transistor TR4. The fourth transistor TR4 includes a control gate connected to the first input terminal IN1, an input electrode connected to the first input terminal IN1 and an output electrode connected to the Q node Q.

The charging part 220 includes a capacitor charged in response to the (n−1)th carry signal CRn−1 provided from the buffer part 210. A first terminal of the capacitor of the charging part 220 is connected to the Q node Q, and a second terminal of the capacitor is connected to the output node O of the stage SRCn at which the gate signal Gn is outputted. When a high voltage VDD of the (n−1)th carry signal CRn−1 is applied to the buffer part 210, the capacitor of the charging part 220 charges to a first voltage V1 corresponding to the high voltage VDD.

The pull-up part 230 outputs the gate signal Gn to output node O of the stage SRCn. The pull-up part 230 includes a first transistor TR1. The first transistor TR1 includes a control gate connected to the Q node Q, an input electrode connected to the first clock terminal CT1 and an output electrode connected to the output electrode O of the stage SRCn. The output node O of the stage SRCn is connected to the first output terminal OT1 of the stage SRCn.

In a case in which the first voltage V1 charged in the capacitor of the charging part 220 is applied to the control electrode of the pull-up part 230 (i.e., to the control gate of the first transistor TR1), when the first clock terminal CT1 receives the high voltage VDD of the clock signal CK, the voltage applied to the control electrode of the pull-up part 230 is bootstrapped. In this case, the Q node Q connected to the control electrode of the pull-up part 230 is boosted up to a boosting voltage VBT at the first voltage V1. Thus, the Q node Q has the first voltage V1 at an (n−1)th time interval Tn−1, and has the boosting voltage VBT at the next (n-th) time interval Tn.

During the n-th time interval Tn in which the boosting voltage VBT is applied to the control electrode of the pull-up part 230, the pull-up part 230 outputs the high voltage VDD of the clock signal CK as the high voltage VDD of the n-th gate signal Gn. The n-th gate signal Gn is outputted through the first output terminal OT1 connected to the output node O.

The carry part 240 outputs the carry signal CR (CRn) to the carry node R. The carry part 240 includes a fifteenth transistor TR15. The fifteenth transistor TR15 includes a control gate connected to the Q node Q, an input electrode connected to the clock terminal CT, and an output electrode connected to the carry node R. The carry node R is connected to the second output electrode OT2.

The carry part 240 may further include a capacitor C (not shown) connected between the control gate and the output electrode of the fifteenth transistor TR15. When a high voltage is applied to the Q node Q, the carry part 240 outputs the high voltage VDD of the clock signal CK (which is received to the first clock terminal CT1) as the n-th carry signal CRn. The n-th carry signal CRn is outputted through the second output terminal OT2 connected to the R node R.

The discharging part 250 discharges the high voltage of the Q node Q down to a second low voltage VSS2 having a level lower than the first low voltage VSS1 (in response to at least one received carry signals) outputted from the following stages. In the present exemplary embodiment, the discharging part 250 sequentially discharges the voltage of the Q node Q into the first and second low voltages VSS1 and VSS2 in response to the (n+1)th and (n+2)th carry signals CRn+1 (Gn+1) and CRn+2 (Gn+2). The discharging part 250 discharges the voltage of the carry node R into the second low voltage VSS2 in response to the (n+1)th carry signal Gn+1.

The discharging part 250 includes a first discharging part 251, a second discharging part 252 and a third discharging part 253.

The first discharging part 251 includes a ninth transistor TR9. The ninth transistor TR9 includes a control gate connected to the second input terminal IN2, an input electrode connected to the Q node Q and an output electrode connected to the first voltage terminal VT1. When the (n+1)th carry signal CRn+1 is applied to the second input terminal IN2, the first discharging part 251 discharges the voltage of the Q node Q to the first low voltage VSS1 applied to the first voltage terminal VT1.

The second discharging part 252 includes a sixth transistor TR6. The sixth transistor TR6 includes a control gate connected to the third input terminal IN3, an input electrode connected to the Q node Q and an output electrode connected to the second voltage terminal VT2. When the (n+2)th carry signal CRn+2 is applied to the third input terminal IN3, the second discharging part 252 discharges the voltage of the Q node Q to the second low voltage VSS2 applied to the second voltage terminal VT2.

Thus, the voltage of the Q node Q has the boosting voltage VBT at an n-th time interval Tn. The voltage of the Q node Q is discharged into the first low voltage VSS1 at an (n+1)th time interval Tn+1, and is discharged into the second low voltage VSS2 at an (n+2)th time interval Tn+2.

The third discharging part 253 discharges the voltage of the carry node R into the second low voltage VSS2. The third discharging part 253 includes a fifth transistor TR5. The fifth transistor TR5 includes a control gate connected to the second input terminal IN2, an input electrode connected to the carry node R and an output electrode connected to the second voltage terminal VT2. The third discharging part 253 discharges the voltage of the carry node R into the second low voltage VSS2 in response to a high voltage of the (n+1)th carry signal CRn+1.

Thus, the voltage of the carry node R is the high voltage VDD of a clock signal CK received at the clock terminal CT in the n-th time interval Tn of a frame, and the voltage of the carry node R is discharged into the second low voltage VSS2 in the (n+1)th time interval Tn+1. Accordingly, the third discharging part 253 discharges the voltage of the carry node R into the second low voltage VSS2, so that the first holding part 281 may secure the second low voltage VSS2 during the remaining frame interval. Therefore, the high voltage VDD margin of the gate signal Gn may be enhanced.

Moreover, the fifth transistor TR5 is connected in parallel to the eleventh transistor TR11. The fifth transistor TR5, like the eleventh transistor TR11, is connected between the fifteenth transistor TR15 and VT2 (VSS2). Thus, an input electrode of the fifth transistor TR5 is connected to an output electrode of the fifteenth transistor TR15, and an output electrode of the fifth transistor TR5 is connected to an output electrode of the eleventh transistor TR11. The input electrodes and output electrodes of the fifth, eleventh and fifth transistors TR5, TR11 and TR15 are patterned from the same metal layer, so that the input electrodes and output electrodes of the fifth, eleventh and fifth transistors TR5, TR11 and TR15 may be not connected to each other through a contact electrode. Although the fifth transistor TR5 is formed, an additional contact electrode is not required so that the formation size of a gate driving circuit may be not increased.

The pull-down part 260 pulls-down the n-th gate signal Gn. The pull-down part 260 includes a second transistor TR2. The second transistor TR2 includes a control gate connected to the second input terminal IN2, an input electrode connected to the output node O and an output electrode connected to the first voltage terminal VT1. When an (n+1)th gate signal Gn+1 is applied to the second input terminal IN2, the pull-down part 260 pulls-down the voltage of the output node O into the first low voltage VSS1 applied to the first voltage terminal VT1.

The switching part 270 applies a signal, which has a phase identical to that of the clock signal CK received at the first clock terminal CT1, to the N node N during a time interval excepting the output interval of the n-th carry signal CRn. The switching part 270 includes a twelfth transistor TR12, a seventh transistor TR7, a thirteenth transistor TR13 and an eighth transistor TR8.

The twelfth transistor TR12 includes a control gate and an input electrode that are connected to the clock terminal CT, and an output electrode connected to the input electrode of the thirteenth transistor TR13 and to the control gate of the seventh transistor TR7. The seventh transistor TR7 includes a control gate connected to the output electrode of the twelfth transistor TR12, an input electrode connected to the clock terminal CT, and an output electrode connected to the input electrode of the eighth transistor TR8 at node N. An output electrode of the seventh transistor TR7 and the input of the eighth transistor TR8 are connected to the N node N.

The thirteenth transistor TR13 includes a control gate connected to the carry node R, an input electrode connected to the twelfth transistor TR12 and an output electrode connected to the first voltage terminal VT1. The eighth transistor TR8 includes a control gate connected to the carry node R, an input electrode connected to the N node N and an output electrode connected the first voltage terminal VT1.

After an n-th time interval Tn of a frame, during which a high voltage is applied to the carry node R, the switching part 270 discharges the clock signal CK received through the clock terminal CT into the first low voltage VSS1 applied to the first voltage terminal VT1. Thus, the eighth and thirteenth transistors TR8 and TR13 are turned ON in response to a high voltage of the carry node R. Accordingly, the clock signal CK is discharged into the first low voltage VSS1 after the n-th time interval Tn.

The first holding part 281 maintains the voltage of the carry node R. The first holding part 281 includes an eleventh transistor TR11. The eleventh transistor TR11 includes a control gate connected to the N node N, an input electrode connected to the carry node R and an output electrode connected to the second voltage terminal VT2. The first holding part 281 maintains the voltage of the carry node R at the second low voltage VSS2 in response to a voltage of the N node N during a remaining time of the frame.

The second holding part 282 maintains a voltage of the Q node Q. The second holding part 282 includes a tenth transistor TR10. The tenth transistor TR10 includes a control gate connected to the N node N, an input electrode connected to the Q node Q, and an output electrode connected to the second voltage terminal VT2. The second holding part 282 maintains the voltage of the Q node Q to the second low voltage VSS2 in response to the voltage of the N node N during the remaining time interval of the frame.

The third holding part 283 maintains the voltage of the output node O. The third holding part 283 includes a third transistor TR3. The third transistor TR3 includes a control gate connected to the N node N, an input electrode connected to the Q node Q, and an output electrode connected to the first voltage terminal VT1. The third holding part 283 maintains the voltage of the output node O at the first low voltage VSS1 applied to the first voltage terminal VT1 in response to the voltage of the N node N during the remaining time interval of the frame.

A gate-source voltage VGS of the first transistor TR1 included in the pull-up part 230 may be defined as the difference between the voltage Qnode_V at the node Q and the voltage of at the output node Onode_V (i.e., VGS=Qnode_V−Onode_V). In a conventional gate drive circuit, noise may be generated at a high temperature. For example, a the temperature of a display panel at room temperature may be increased to about 35 degrees Celsius (° C.) to about 40 degrees Celsius due to a backlight. When the temperature of the display panel is increased, the drain current of the first transistor TR1 is increased so that a leakage current may be increased.

The increased leakage current is applied to the Q node Q of the following stage through the fifteenth transistor TR15 of the carry part 240, so that the first transistor TR1 of the following stage is bootstrapped in another time interval (not a time interval in which the following stage should be driven). Thus, a high temperature noise may be generated.

In the present exemplary embodiment, it is by design that a gate-source voltage VGS is a negative voltage while the first transistor TR1 is turned-OFF, so that a leakage current may be decreased. Thus, a noise problem which is generated by increasing of a drain current at a high temperature may be avoided. Moreover, the number of transistors is small in comparison with the number of transistors in a conventional gate drive circuit, so that the integrated size of a gate drive circuit on a semiconductor chip may be decreased.

Figure 19:
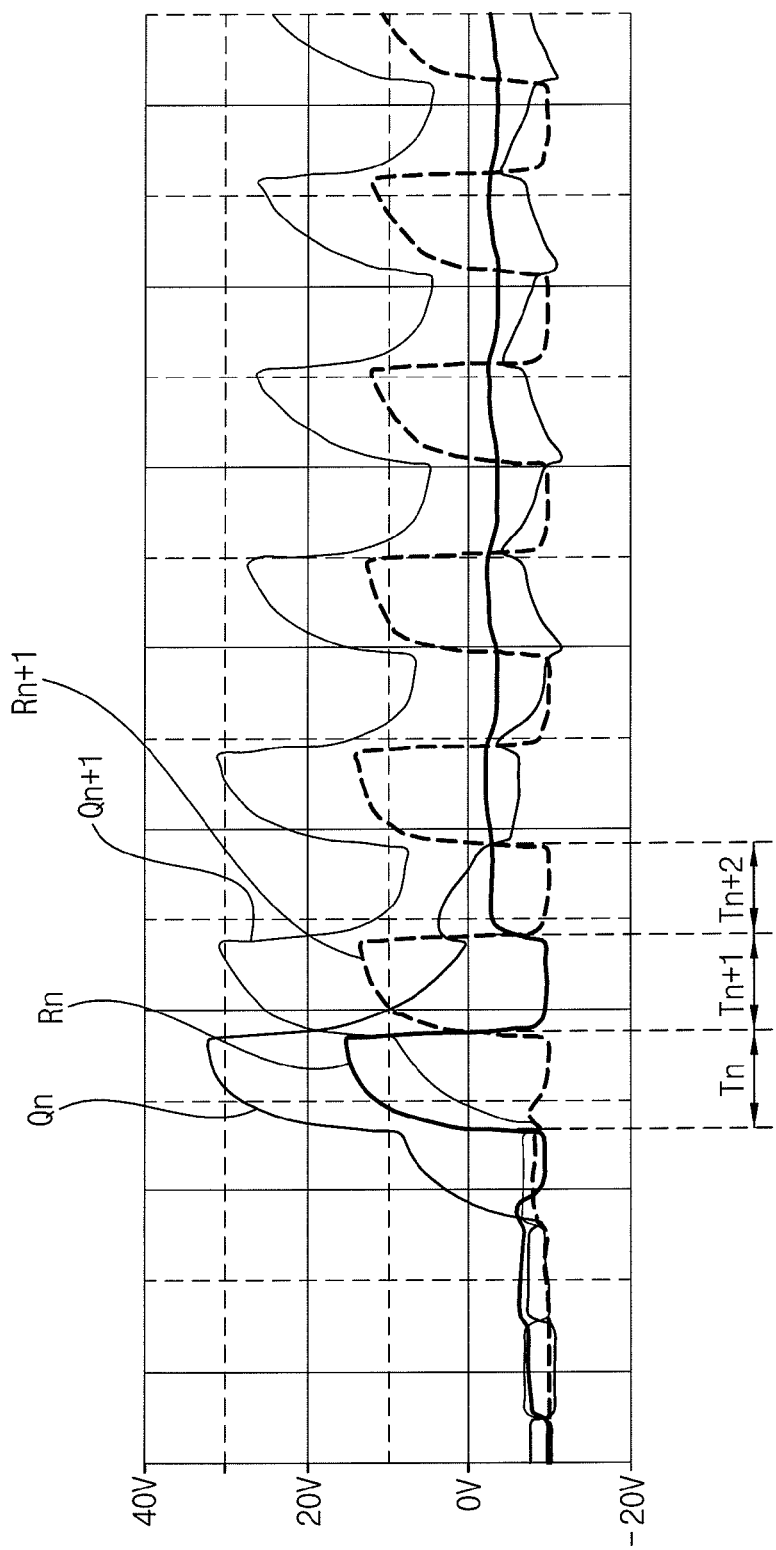
FIG. 19 is a waveform diagram illustrating a simulation of the voltage of a carry node according to a comparative embodiment.
Figure 20:
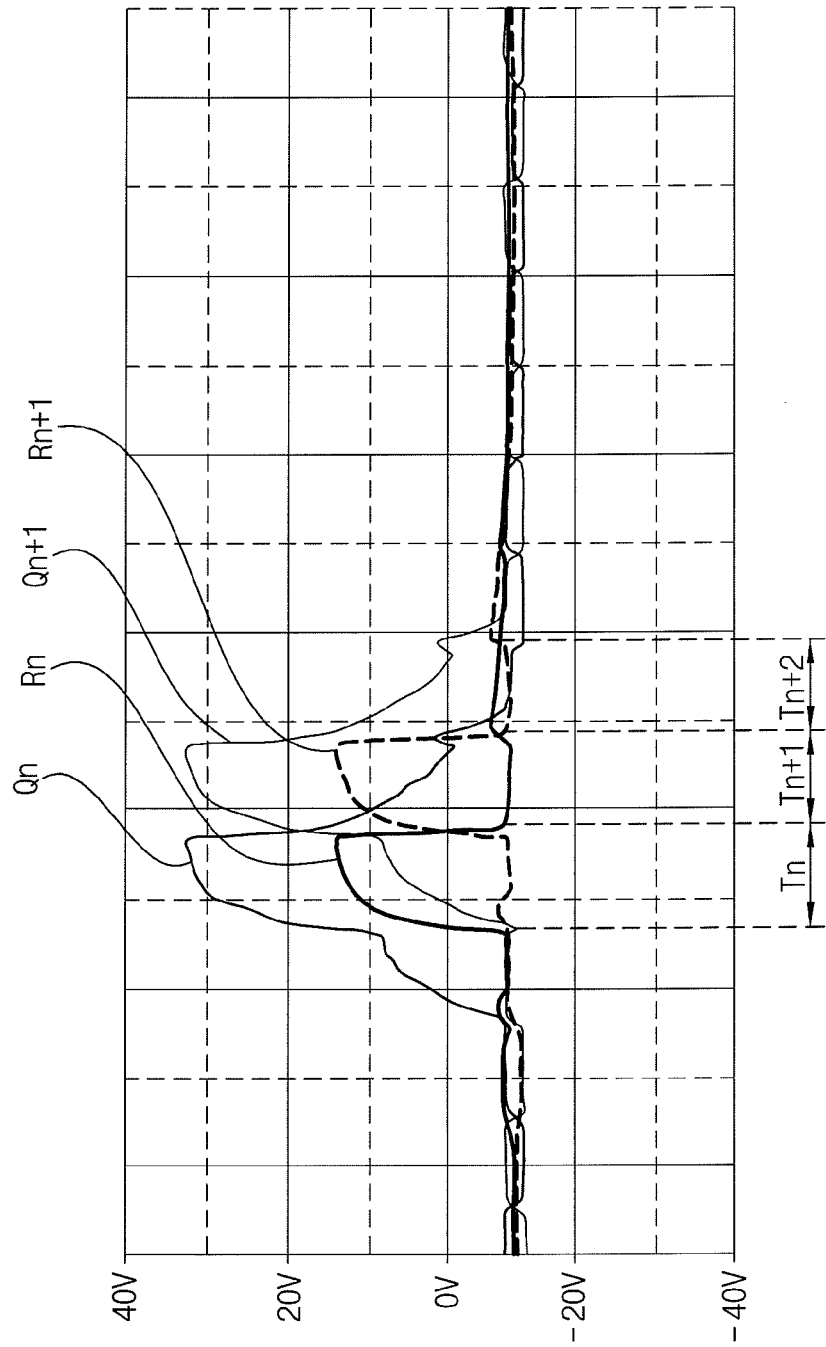
FIG. 20 is a waveform diagram illustrating a simulation of a voltage of the carry node shown in FIG. 17.

FIG. 19 is a waveform diagram illustrating a simulation of the voltage of a carry node according to a comparative embodiment. FIG. 20 is a waveform diagram illustrating a simulation of the voltage of the carry node R shown in FIG. 17.

Referring to FIGS. 17 and 19, a stage according to a comparative embodiment is a circuit in which a third discharging part 253 discharges the carry node R in an n-th stage as shown in FIG. 17.

According to the comparative embodiment, an n-th stage outputs the high voltage of the clock signal CK as an n-th carry signal CRn in response to a boosting voltage of the Q node Q. Thus, a signal Rn of the carry node R has a high voltage during the n-th time interval Tn.

Then, during an (n+1)th time interval Tn+1, the voltage of the Q node Q is discharged into a first low voltage VSS1 by the first discharging part 251, and the signal Rn of the carry node R is pull-downed to the low voltage VSS1 of the clock signal CK.

Then, the first holding part 281 maintains the signal Rn of the carry node R at second low voltage VSS2, and the second holding part 282 maintains the signal Qn of the Q node Q at the second low voltage VSS2.

The Q node Q is discharged into a second low voltage VSS2 by the second discharging part 252 in response to a (n+2)th carry signal CRn+2 during an (n+2)th time interval Tn+2, so that the Q node Q may be maintained at the second low voltage VSS2 by the second holding part 282 during the remainder of the frame. Since a discharging part does not exist, a signal Rn of the carry node R is maintained at a voltage higher than the second low voltage VSS2 which is a signal Qn of the Q node Q during the remainder of the frame.

When the n-th carry signal CRn (a signal Rn of the carry node R from the following (n+1)th stage) is maintained at a voltage higher than the first and second low voltages VSS1 and VSS2, the n-th carry signal CRn interrupts the discharging of the following stage (i.e., of an Q node Q of an (n+1)th stage) operated by the n-th carry signal CRn.

Thus, during an (n+2)th time interval Tn+2, when the n-th carry signal CRn has a second low voltage VSS2 in the (n+1)th stage, the n-th carry signal CRn turns OFF the pull-up part 410 and the first discharging part 251 discharges the signal Qn+1 of the Q node Q into the first low voltage VSS1 in response to the (n+2)th carry signal CRn+2. However, the n-th carry signal CRn has a voltage higher than the second low voltage VSS2 and the pull-up part 410 does not have a normal OFF state, so the discharging of the first discharging part 251 is interrupted. Thus, the signal Qn+1 of the Q node Q is not discharged into a normal first low voltage VSS1. Accordingly, the margin of the (n+1)th gate signal G outputted from the (n+1)th stage may be reduced.

Referring to FIGS. 17 and 20, the n-th stage of the present exemplary embodiment stably discharges the signal Rn of the carry node R into the second low voltage VSS2 by using the third discharging part 253. Then, the n-th stage maintains the signal Rn of the carry node R at the second low voltage VSS2 during the remainder of the frame through the first holding part 281.

Hereinafter, the elements that have been labeled the same have the same characteristics as elements described in the above exemplary embodiments, and any repetitive detailed description thereof will hereinafter be omitted or simplified.

Figure 21:
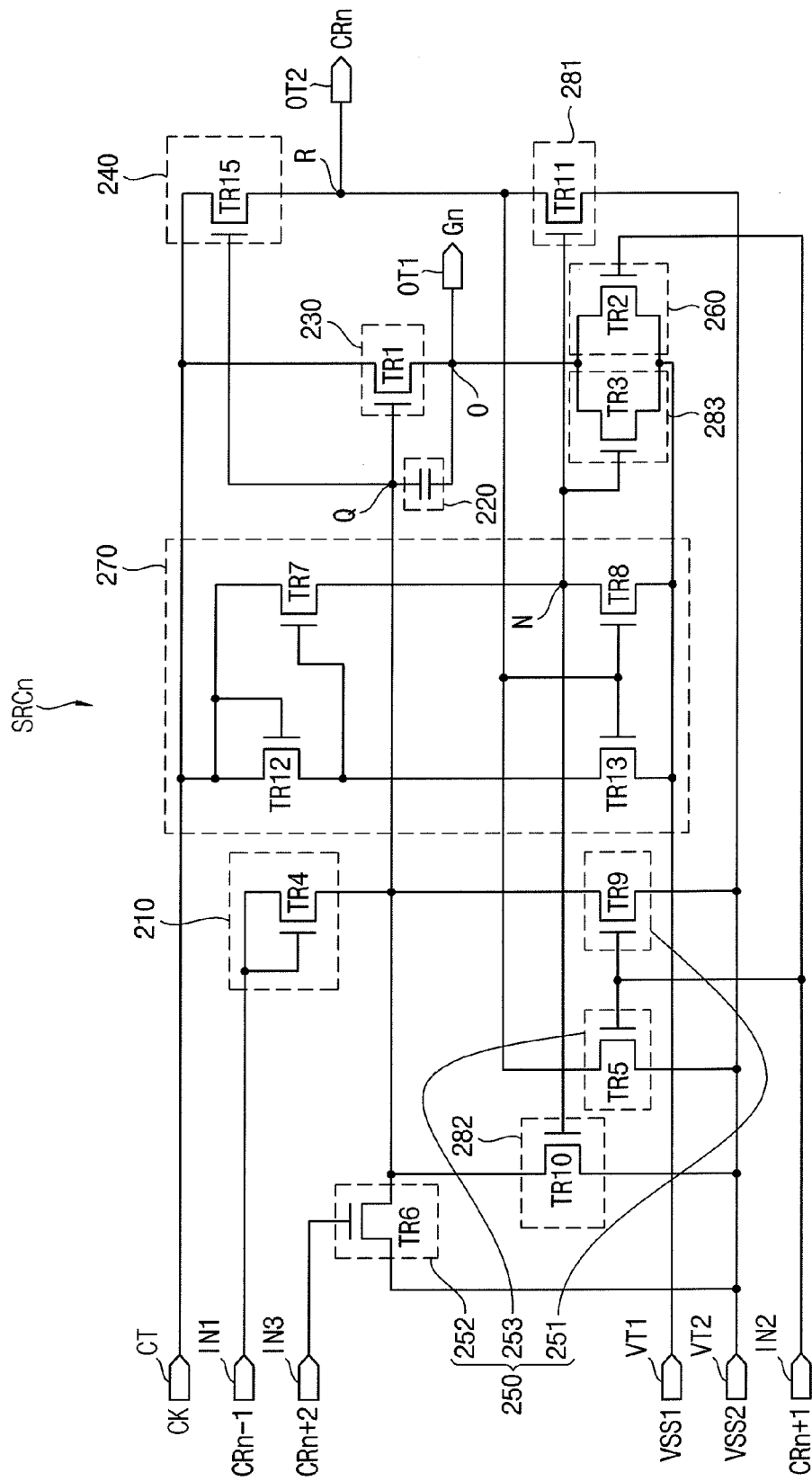
FIG. 21 is a circuit diagram of the n-th stage SRCn (version 8) of the gate drive circuit 200-1 of FIG. 2 according to still another exemplary embodiment of the present invention.

FIG. 21 is a circuit diagram of the n-th stage SRCn (version 7) of the gate drive circuit 200-1 of FIG. 2 according to still another exemplary embodiment of the present invention.

Referring to FIG. 21, the n-th stage SRCn includes a buffer part 210, a charging part 220, a pull-up part 230, a carry part 240, a discharging part 250, a pull-down part 260, a switching part 270, a first holding part 281, a second holding part 282 and a third holding part 283.

The discharging part 250 includes a first discharging part 251, a second discharging part 252 and a third discharging part 253.

The first discharging part 251 includes a ninth transistor TR9. The ninth transistor TR9 includes a control gate connected to the second input terminal IN2, an input electrode connected to the Q node Q and an output electrode connected to the second voltage terminal VT2. When the (n+1)th carry signal CRn+1 is applied to the second input terminal IN2, the first discharging part 251 discharges the voltage of the Q node Q to the second low voltage VSS2 applied to the second voltage terminal VT2. Accordingly, a high temperature margin of the gate drive circuit 200 (200-1 of FIG. 2) according to the present exemplary embodiment should be greater than as in the exemplary embodiment described in FIG. 17.

The second discharging part 252 includes a sixth transistor TR6. The sixth transistor TR6 includes a control gate connected to a third input terminal IN3, an input electrode connected to the Q node Q and an output electrode connected to the second voltage terminal VT2. When the (n+2)th carry signal CRn+2 is applied to the third input terminal IN3, the second discharging part 252 discharges the voltage of the Q node Q to the second low voltage VSS2 applied to the second voltage terminal VT2.

Thus, the voltage of the Q node Q has the boosting voltage VBT at an n-th time interval Tn. The voltage of the Q node Q is discharged into the first low voltage VSS1 at an (n+1)th time interval Tn+1, and is discharged into the second low voltage VSS2 at an (n+2)th time interval Tn+2.

The third discharging part 253 discharges the voltage of the carry node R into the second low voltage VSS2. The third discharging part 253 includes a fifth transistor TR5. The fifth transistor TR5 includes a control gate connected to the second input terminal IN2, an input electrode connected to the carry node R and an output electrode connected to the second voltage terminal VT2. The third discharging part 253 discharges the voltage of the carry node R into the second low voltage VSS2 in response to a high voltage of the (n+1)th CRn+1.

Thus, the voltage of the carry node R is the high voltage VDD of the clock signal CK received at the clock terminal CT in the n-th time interval Tn of a frame, and the voltage of the carry node R is discharged into the second low voltage VSS2 in the (n+1)th time interval Tn+1.

Accordingly, the third discharging part 253 discharges the voltage of the carry node R into the second low voltage VSS2, so that the first holding part 281 may secure the second low voltage VSS2 during the remaining time interval of the frame. Therefore, the high voltage VDD margin of the gate signal Gn may be enhanced.

Figure 22:
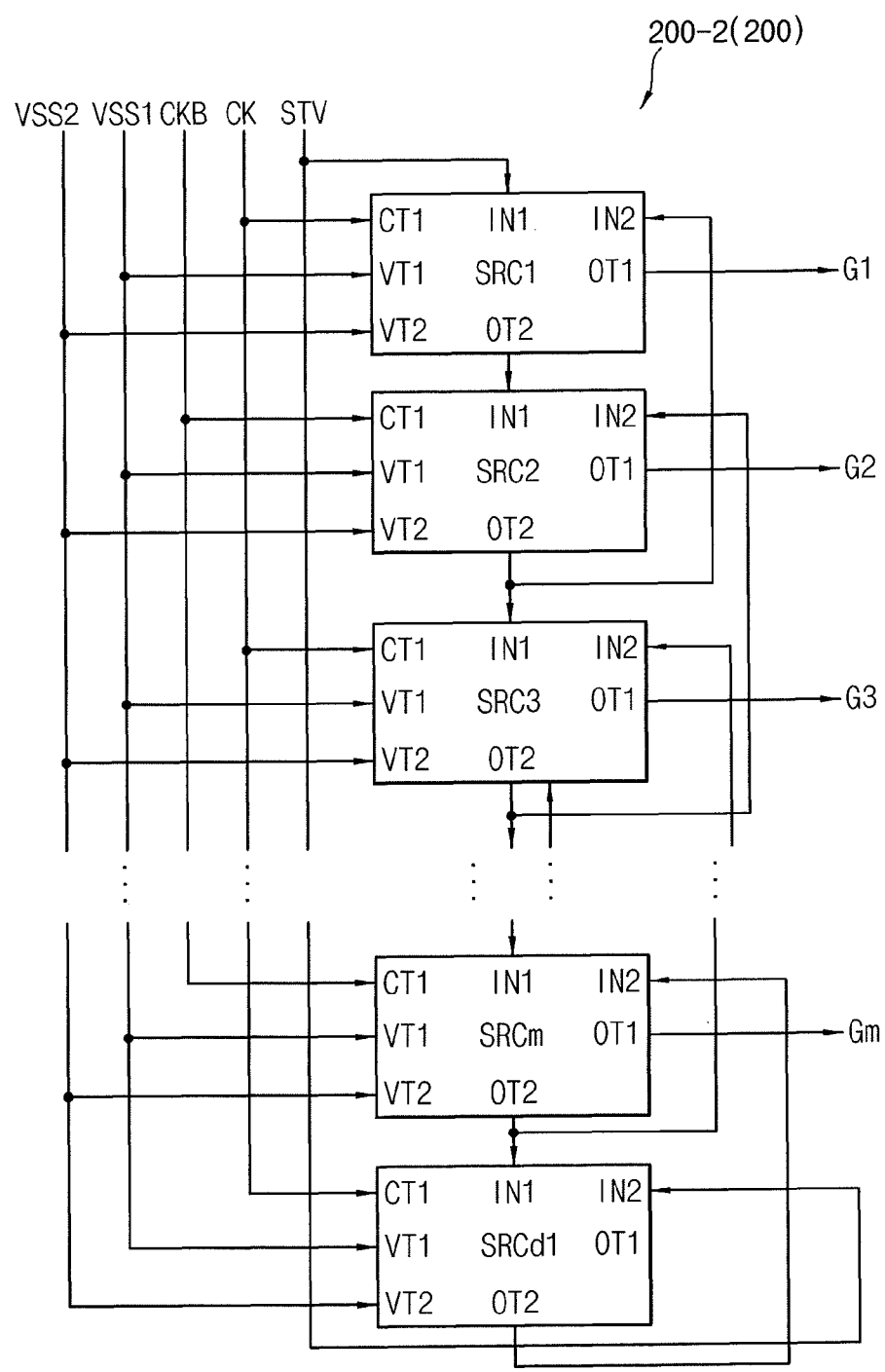
FIG. 22 is a block diagram of a gate drive circuit 200-2 (200) in the display apparatus of FIG. 1 according to another exemplary embodiment of the present invention.

FIG. 22 is a block diagram of a gate drive circuit 200-2 (200 in the display apparatus of FIG. 1) according to still another exemplary embodiment of the present invention.

Referring to FIG. 22, the gate drive circuit 200-2 includes a shift register including first to m-th stages SRC1 to SRCm and a first dummy stage SRCd1 that are cascade-connected to each other.

The first to m-th stages SRC1 to SRCm are respectively connected to m gate lines to sequentially provide the gate lines with m gate signals G1 through Gm. The first dummy stage SRCd1 controls driving of the m-th stage SRCm. The second dummy stage SRCd1 is not connected to the gate lines.

Each of the stages includes a first clock terminal CT1, a first input terminal IN1, a second input terminal IN2, a first voltage terminal VT1, a second voltage terminal VT2, a first output terminal OT1 and a second output terminal OT2.

Each of the stages is substantially the same as the n-th stage SRCn (version 1) shown in FIG. 2 except that the stage does not include a third input terminal IN3 receiving an (n+2)th carry signal CRn+2 from a following stage. The elements shown in FIG. 22 that have been labeled the same have the same characteristics as elements of the exemplary embodiments of the n-th stage SRCn (version 1) shown in FIG. 2, and any repetitive detailed description thereof will hereinafter be omitted or simplified.

The first input terminal IN1 receives a vertical start signal STV or one carry signal outputted from the second output terminal OT2 of a previous stage. For example, the first input terminal IN1 of the first stage SRC1 receives the vertical start signal STV, and the first input terminals IN1 of the respective second stage SRC2 to second dummy stage SRCd2 receive the (n−1)th carry signal CRn−1 from second output terminal OT2 a previous (n−1)th stage.

The second input terminal IN2 receives at one carry signal outputted from a following stage or a vertical start signal STV. For example, the second input terminals IN2 of the respective first stage SRC1 to m-th stage SRCm receive the (n+1)th carry signal CRn+1. The second input terminal IN2 of the first dummy stage SRCd1 receives the vertical start signal STV. The vertical signal STV received by the second input terminal IN2 of the first dummy stage SRCd1 may be a vertical start signal corresponding to the following frame.

The first dummy stage SRCd1 may be substantially identical to the second dummy stage SRCd2 (version 1) shown in FIG. 6.

Figure 23:
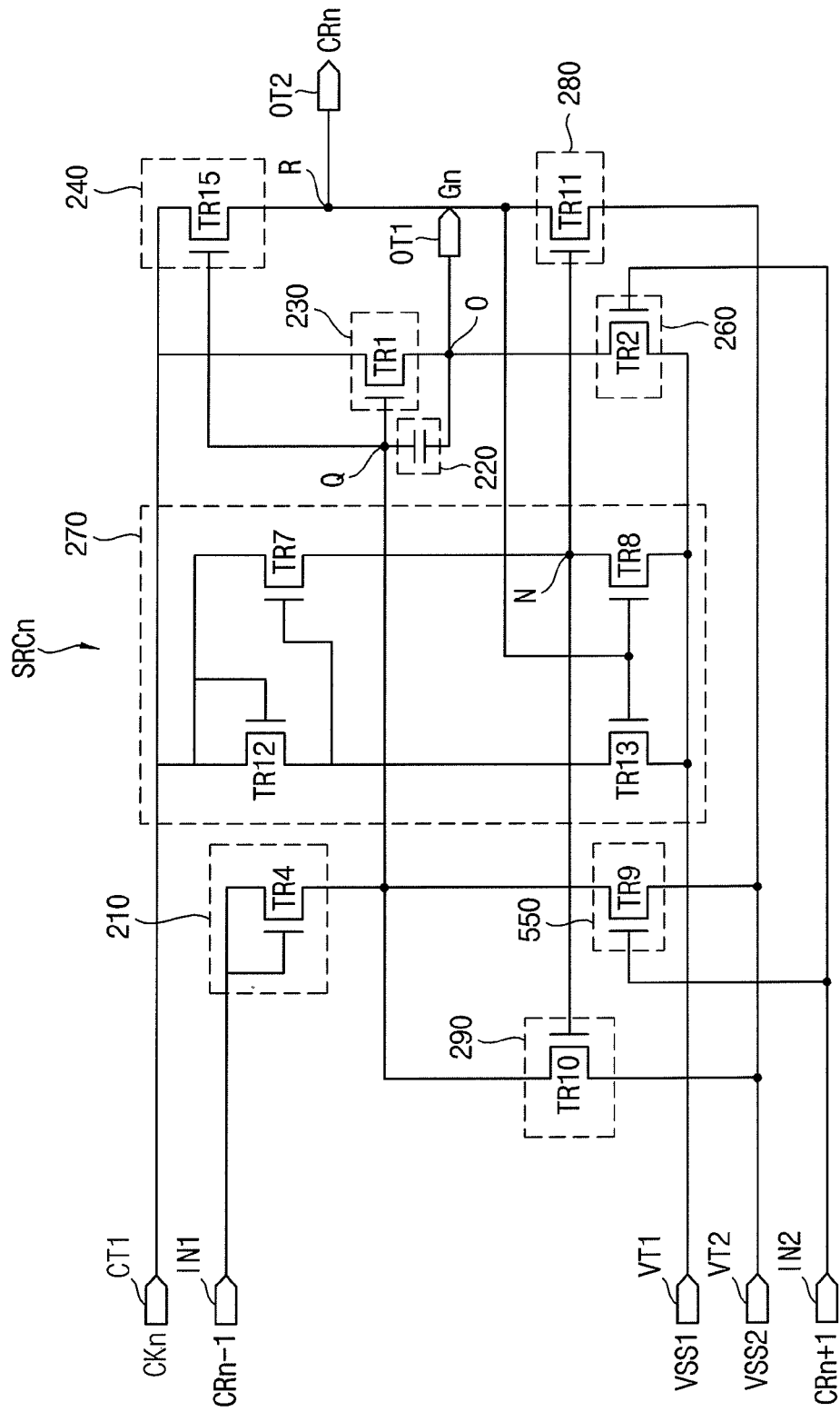
FIG. 23 is a circuit diagram of the n-th stage SRCn (version 9) of the gate drive circuit 200-2 of FIG. 22.
Figure 24:
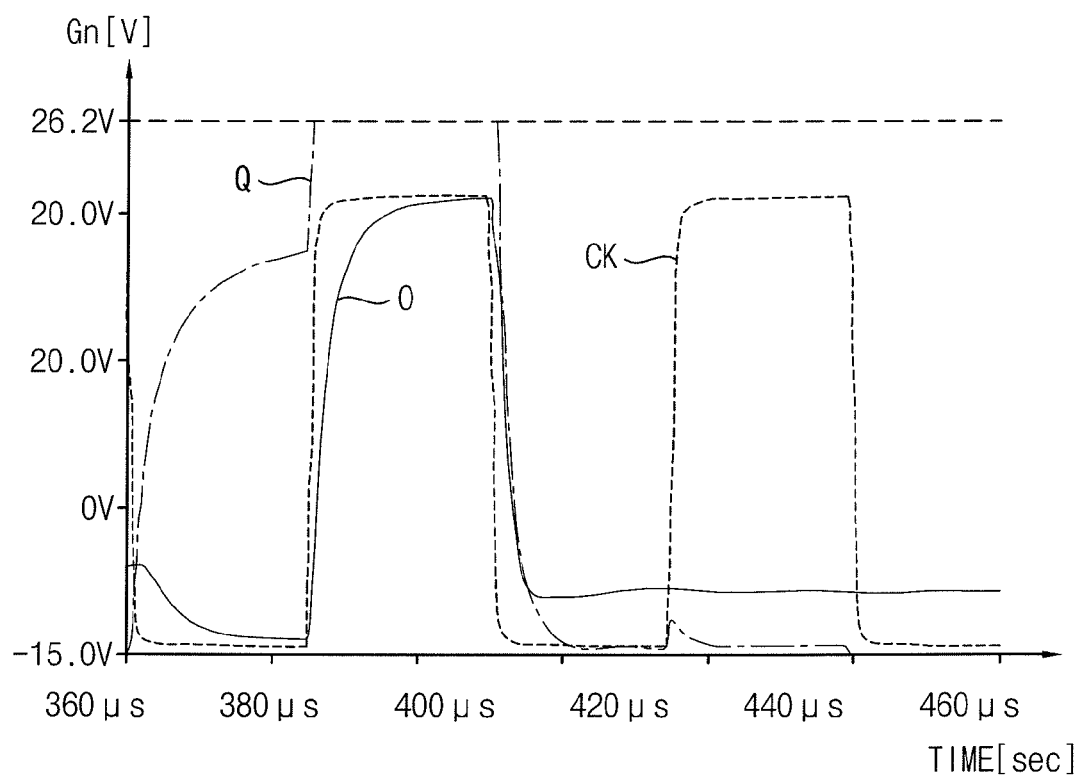
FIG. 24 is a waveform diagram illustrating a simulation of the voltage of the Q node and the output voltage Gn of the n-th stage SRCn shown in FIG. 23 of the gate drive circuit 200-2 of FIG. 22.

FIG. 23 is a circuit diagram of the n-th stage SRCn (version 9) of the gate drive circuit 200-2 of FIG. 22. FIG. 24 is a waveform diagram illustrating a simulation of the voltage of the Q node and the output voltage of the output node O of the stage SRCn shown in FIG. 23 of the gate drive circuit 200-2 shown in FIG. 22.

Referring to FIG. 23, an n-th stage SRCn according to the present exemplary embodiment is substantially the same as the n-th stage SRCn (version 1) shown in FIG. 3 except for the discharging part 550. The elements shown in FIG. 23 that have been labeled the same have the same characteristics as elements of the exemplary embodiments of the n-th stage SRCn (version 1) shown in FIG. 3, and any repetitive detailed description thereof will hereinafter be omitted or simplified.

The discharging part 550 discharges the voltage of the Q node Q to the second low voltage VSS2 in response to the (n+1)th carry signal CRn+1 (mirroring Gn+1). The discharging part 550 includes a ninth transistor TR9. The ninth transistor TR9 includes a control gate connected to the second input terminal IN2, an input electrode connected to the Q node Q, and an output electrode connected to the second voltage terminal VT2.

In the present exemplary embodiment, since the discharging part 550 discharges the voltage of the Q node Q by using the (n+1)th carry signal CRn+1 mirroring Gn+1, the discharging part 550 includes only one transistor TR9. Thus, the integrated area of the gate drive circuit (e.g., formed on a semiconductor substrate) may be decreased.

Referring to FIG. 24, it is seen that the falling time of the output voltage is further delayed compared to the falling time of the output voltage in the stage SRCn (version 1) of FIG. 3. However, the size of transistors (not shown) that are formed on a second portion of the peripheral area PA on which the gate drive circuit 200 (200-2) is formed to discharge the gate signal, may be increased, so that the delay of the falling time of the output voltage may be compensated. Moreover, the size of transistors formed on a second portion of the peripheral area is not included in the integrated area of the gate drive circuit, so that the integrated area of the gate drive circuit according to the present exemplary embodiment may be decreased.

Figure 25:
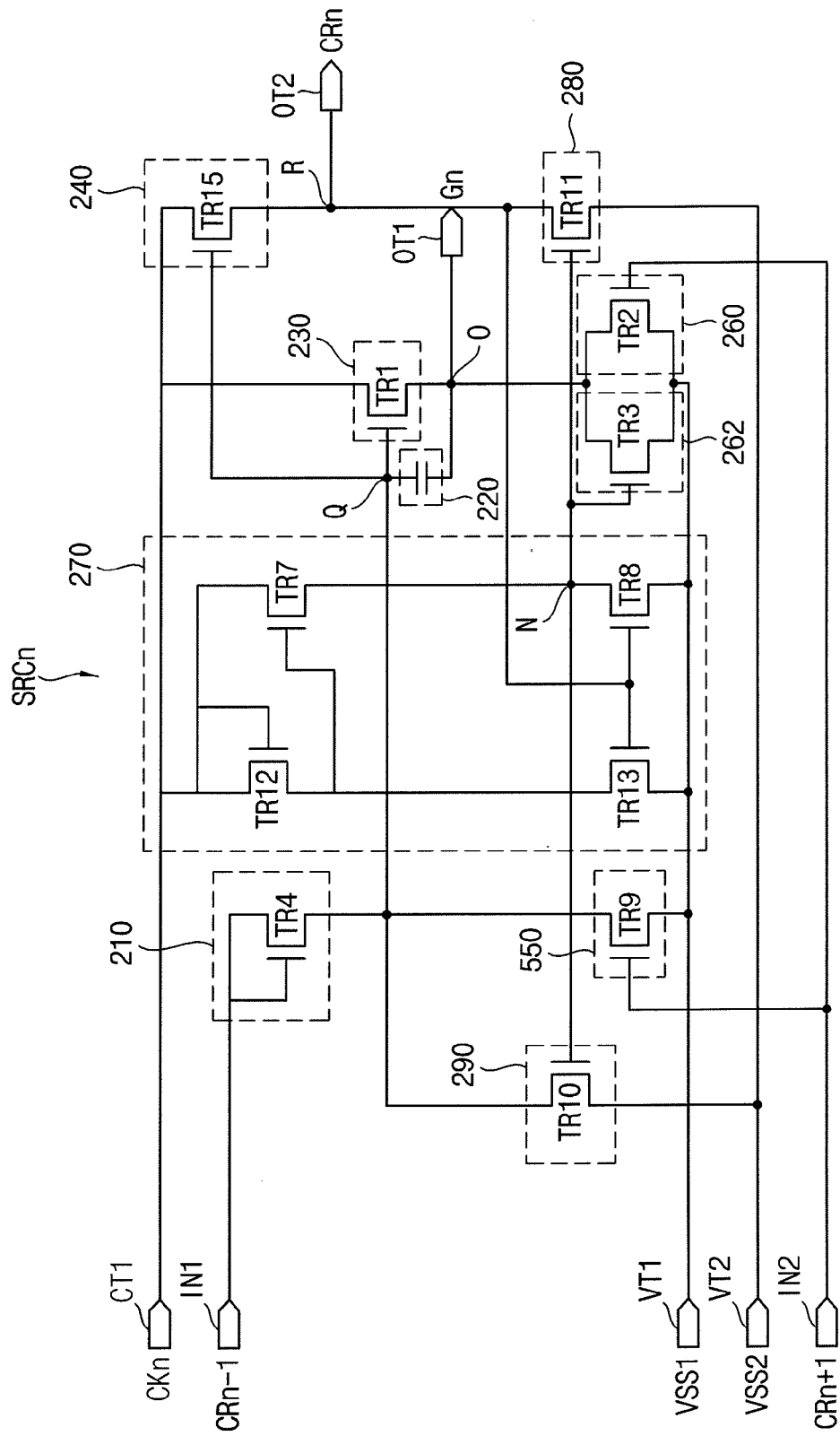
FIG. 25 is a circuit diagram illustrating the n-th stage SRCn (version 10) of a gate drive circuit in the display apparatus of FIG. 1 according to still another exemplary embodiment of the present invention.

FIG. 25 is a circuit diagram illustrating the n-th stage SRCn (version 10) of a gate drive circuit 200-1 of FIG. 2 according to still another exemplary embodiment of the present invention.

Referring to FIG. 25, an n-th stage SRCn (version 10) is substantially the same as the n-th stage SRCn (version 9) shown in FIG. 23 except for a third holding part 262. The elements shown in FIG. 25 that have been labeled the same have the same characteristics as elements of the exemplary embodiments of the n-th stage SRCn (version 9) shown in FIG. 23, and any repetitive detailed description thereof will hereinafter be omitted or simplified.

The third holding part 262 maintains the voltage of the output node O. The third holding part 262 includes a third transistor TR3. The third transistor TR3 includes a control gate connected to the N node N, an input electrode connected to the output node O, and an output electrode connected to the first voltage terminal VT1. The third holding part 262 maintains the voltage of the output node O at the first low voltage VSS1 applied to the first voltage terminal VT1 in response to the voltage of the N node N during the remaining time interval of the frame.

In the present exemplary embodiment, since the n-th stage SRCn (version 10) further includes the third holding part 262, the voltage of the output node O which is pulled down into the first low voltage VSS1 by the pull-down part 260 may be maintained stable.

Figure 26:
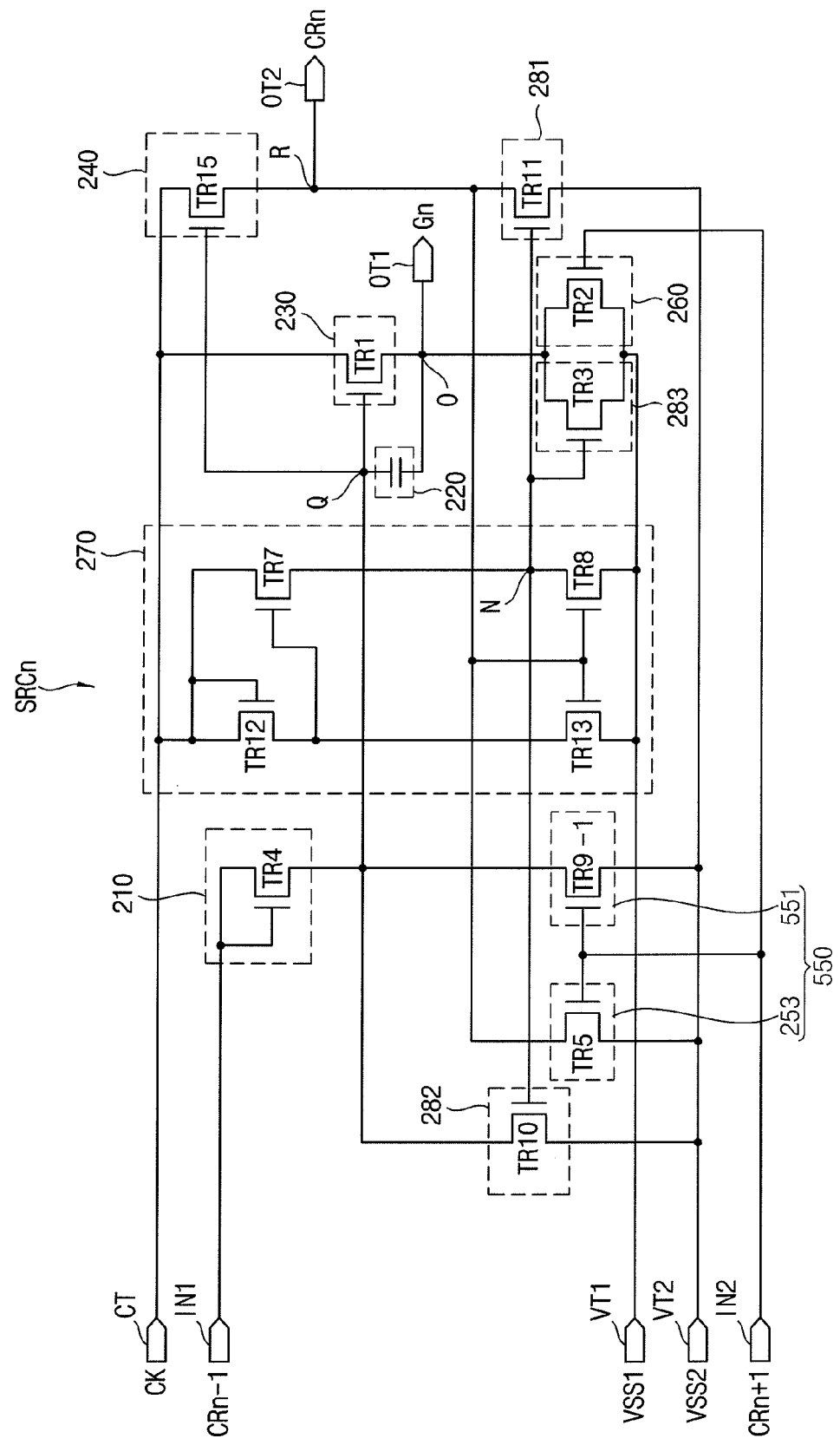
FIG. 26 is a circuit diagram illustrating the n-th stage SRCn (version 11) of a gate drive circuit 200-2 in the display apparatus of FIG. 1 according to still another exemplary embodiment of the present invention.

FIG. 26 is a circuit diagram illustrating the n-th stage SRCn (version 11) of a gate drive circuit 200-2 in the display apparatus of FIG. 1 according to still another exemplary embodiment of the present invention.

Referring to FIGS. 22 and 26, an n-th stage SRCn includes a buffer part 210, a charging part 220, a pull-up part 230, a carry part 240, a discharging part 550, a pull-down part 260, a switching part 270, a first holding part 281, a second holding part 282 and a third holding part 283. The n-th stage SRCn according to the present exemplary embodiment is substantially the same as the n-th stage SRCn shown in FIG. 25 except for a discharging part 550. The elements shown in FIG. 26 that have been labeled the same have the same characteristics as elements of the exemplary embodiments of the n-th stage SRCn shown in FIG. 25, and any repetitive detailed description thereof will hereinafter be omitted or simplified.

The discharging part 550 includes a first discharging part 551 and a third discharging part 253. Thus, a second discharging part 252 is omitted from the discharging part 550, as compared with the n-th stage STCn described in FIGS. 17 and 21.

The first discharging part 551 includes a ninth transistor TR9-1. The ninth transistor TR9-1 includes a control gate connected to the second input terminal IN2, an input electrode connected to the Q node Q and an output electrode connected to the second voltage terminal VT2. When the (n+1)th carry signal CRn+1 is applied to the second input terminal IN2, the first discharging part 551 discharges the voltage of the Q node Q into the second low voltage VSS2 applied to the second voltage terminal VT2. Accordingly, the high temperature margin of a gate drive circuit according to the present exemplary embodiment should be secured as compared with the exemplary embodiment described in FIG. 25.

Moreover, the ninth transistor TR9-1 of the first discharging part 551 is formed to have a size greater than the ninth transistor TR9 of the first discharging part 251 described in FIGS. 17 and 21. Accordingly, the sixth transistor TR6 included in the second discharging part 252 described in FIGS. 17 and 21 may compensate for the size of the ninth transistor TR9-1. As a result, the formation size of the gate drive circuit according to the present exemplary embodiment may be decreased compared to that of the gate drive circuit described in FIGS. 17 and 21.

The third discharging part 253 discharges a voltage of the carry node R into the second low voltage VSS2. The third discharging part 253 includes a fifth transistor TR5. The fifth transistor TR5 includes a control gate connected to the second input terminal IN2, an input electrode connected to the carry node R and an output electrode connected to the second voltage terminal VT2. The third discharging part 253 discharges the voltage of the carry node R into the second low voltage VSS2 in response to a high voltage of the (n+1)th CRn+1.

Thus, the voltage of the carry node R is the high voltage VDD of the clock signal CK received at the clock terminal CT in the n-th time interval Tn of a frame, and the voltage of the carry node R is discharged into the second low voltage VSS2 in the (n+1)th time interval Tn+1.

Accordingly, the third discharging part 253 discharges the voltage of the carry node R into the second low voltage VSS2, so that the first holding part 281 may secure the second low voltage VSS2 during the remaining frame interval. Therefore, the high voltage VDD margin of the gate signal Gn may be enhanced.

According to the above, according to the present exemplary embodiment, the voltage between the control gate and the output electrode of a pull-up part 230 (transistor TR1) has a negative voltage after gate signals are outputted (after time interval Tn), so that the current leakage of the pull-up part 230 (TR1) is decreased so that the generation of noise may be prevented. Moreover, transistors conventionally provided for controlling the noise may be omitted, so that the integrated area of a gate drive circuit may be decreased. In addition, power consumption may be decreased. Moreover, the voltage of the carry node is stably maintained at a low voltage, so that the driving reliability of the gate drive circuit may be enhanced.

The foregoing is illustrative of the present invention and is not to be construed as limiting thereof. Although exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A gate drive circuit comprising a shift register in which plural stages are cascade-connected to each other, an n-th stage ('n' is a natural number) comprising:
   an output node, connected through a first transistor of a pull-up part to a first clock signal, configured to output the n-th gate signal, wherein the control gate of the first transistor is connected to a first node;
   the pull-up part configured to pull up the output node to a high voltage of the fist clock signal as the high voltage of the n-th gate signal in response to a high voltage of the first node;
   a pull-down part configured to pull down the high voltage at the output node to a first low voltage level in response to an (n+1)th carry signal;
   a discharging part configured to discharge the first node down to a second low voltage level lower than the first low voltage level in response to the (n+1)th carry signal or an (n+2)th carry signal;
   a carry part configured to output the high voltage in response to the high voltage at the first node while outputting the high voltage of the n-th gate signal; and
   a first holding part configured to holding the carry signal down to the second low voltage level while not outputting the high voltage of the n-th gate signal,
   wherein the discharging part comprises:
   a first discharging circuit configured to discharge the high voltage at the first node to the first low voltage or the second low voltage in response to the (n+1)th carry signal; and
   a second discharging circuit configured to discharge the high voltage at the first node to the second low voltage level in response to the (n+2)th carry signal.

2. The gate drive circuit of claim 1, wherein the voltage between the control gate of the first transistor and the output electrode of the first transistor is maintained as a negative voltage after the high voltage of the n-th gate signal is outputted.

3. The gate drive circuit of claim 1, further comprising:
a second holding part configured to maintain the voltage of the first node at the second low voltage level in response to the first clock signal.

4. The gate drive circuit of claim 1, wherein the first discharging circuit is configured to discharge the high voltage at the first node to the first low voltage in response to the (n+1)th carry signal.

5. The gate drive circuit of claim 4, further comprising:
a third holding part configured to maintain the n-th gate signal at the first low voltage level in response to the first clock signal.

6. The gate drive circuit of claim 1, wherein the first discharging circuit is configured to discharge the high voltage of the first node to the second low voltage level in response to the (n+1)th carry signal.

7. The gate drive circuit of claim 6, further comprising:
a third holding part configured to maintain the n-th gate signal to the first low voltage level in response to the first clock signal.

8. The gate drive circuit of claim 1, wherein the gate drive circuit comprises not more than fifteen transistors and not less than ten field effect transistors (FETs) configured to operate as switches.

9. The gate drive circuit of claim 1, further comprising:
a buffer part comprising a fourth transistor having its control gate connected to a first input terminal receiving an (n−1)th carry signal, and its input electrode connected to the first input terminal and its output electrode connected to the first node.

10. The gate drive circuit of claim 1, further comprising:
a charging capacitor having a first terminal connected to the first node and a second terminal connected to the output node outputting the n-th gate signal.

11. The gate drive circuit of claim 1, further comprising:
a switching part configured to output a signal synchronized with the first clock signal to the first holding part.

12. A display apparatus comprising:
a display panel comprising an image display area in which gate lines and source lines crossing the gate lines are formed and a peripheral area surrounding the image display area;
a source drive circuit configured to output data signals to the source lines; and
a gate drive circuit comprising a shift register in which a plurality of stages is cascade-connected to each other, and wherein an n-th stage ('n' is a natural number) configured to output an n-th gate signal includes:
an output node of the n-th stage configured to output the gate signal of the n-th stage;
a pull-up part configured to output a high voltage of a first clock signal to the output node as the high voltage of the n-th gate signal in response to a high voltage on a first node;
a pull-down part configured to pull the output node down to a first low voltage in response to an (n+1)th carry signal;
a discharging part configured to discharge the first node to a second voltage level lower than the first low voltage level in response to the (n+1)th carry signal;
a carry part configured to outputting the high voltage of the first clock signal as an n-th carry signal in response to a high voltage on the first node; and
a first holding part configured to hold the carry signal at the second low voltage in response to the first clock signal, wherein the discharging part comprises:
a first discharging circuit configured to discharge the high voltage at the first node to the first low voltage or the second voltage in response to the (n+1)th carry signal; and
a second discharging circuit configured to discharge the high voltage at the first node to the second low voltage level in response to the (n+2)th carry signal.

13. The display apparatus of claim 12, wherein the a pull-up part comprises a first transistor wherein the voltage between the control gate of the first transistor and an output electrode of the first transistor is maintained as a negative voltage after a high voltage of the n-th gate signal is outputted.

14. The display apparatus of claim 12, wherein the n-th stage further comprises:
a second holding part configured to hold the voltage at the first node to the second low voltage in response to the first clock signal.

15. The display apparatus of claim 12, wherein the n-th stage further comprises:
a third holding part configured to hold the output node down to the first low voltage in response to the first clock signal.

16. The display apparatus of claim 12, wherein the a first discharging circuit is configured to discharge the high voltage of the first node down to the first low voltage in response to the (n+1)th carry signal.

17. The display apparatus of claim 12, wherein the a first discharging part is configured to discharge the high voltage of the first node down to the second low voltage in response to the (n+1)th carry signal.

18. A gate drive circuit comprising a shift register in which plural stages are cascade-connected to each other, an n-th stage ('n' is a natural number) comprising:
an output node configured to output an n-th sate signal from the n-th stage;
a pull-up part configured to output the high voltage of a first clock signal as the high voltage of the n-th gate signal in response to a high voltage of a control node;
a pull-down part configured to pull down the high voltage of the n-th gate signal to a first low voltage level in response to the (n+1)th carry signal outputted from the following (n+1)th stage;
a first discharging part configured to discharge the high voltage of the control node into the first low voltage or into a second low voltage lower than the first low voltage in response to at the (n+1)th carry signal outputted from the following (n+1)th stage;
a carry part configured to outputting the high voltage of the first clock signal as an n-th carry signal in response to the high voltage of the control node; and
a second discharging part configured to discharge the voltage of the control node into the second low voltage in response to an (n+2)th carry signal outputted from the (n+2)th stage.

19. The gate drive circuit of claim 18, further comprising:
a third discharging part configured to discharge the n-th carry signal into the second low voltage in response to the (n+1)th carry signal outputted from the following (n+1)th stage.

20. The gate drive circuit of claim 18, further comprising a second holding part configured to maintain the voltage of the control node at the second low voltage.

21. The gate drive circuit of claim 18, further comprising a switching part configured to output a signal synchronized with the first clock signal during an interval excepting the output interval of the n-th carry signal of a frame.

22. The gate drive circuit of claim 21, further comprising a first holding part configured to maintain the n-th carry signal at the second low voltage in response to an output signal of the switching part.

23. The gate drive circuit of claim 21, further comprising a second holding part configured to maintaining the voltage of the control node at the second low voltage in response to an output signal of the switching part.

24. The gate drive circuit of claim 21, further comprising a third holding part configured to maintain the n-th gate signal at the first low voltage level in response to an output signal of the switching part.

25. The gate drive circuit of claim 18, wherein the voltage between the control gate and the output electrode of the pull-up part after the high voltage of the n-th gate signal is outputted is maintained at a negative voltage.

26. The gate drive circuit of claim 18, further comprising:
a buffer part comprising a control gate and an input electrode that are connected to a first input terminal receiving an (n−1)th carry signal from a preceding (n−1)th stage and an output electrode connected to the control node; and
a charging part comprising a first terminal connected to the control node and a second terminal connected to the output node outputting the n-th gate signal.

27. A display apparatus comprising:
a display panel comprising a display area on which gate lines and source lines crossing the gate line are formed to display an image and a peripheral area surrounding the display area;
a source drive circuit configured to outputting data signals to the source lines; and
a gate drive circuit comprising a shift register in which plural stages are connected one after another to each other, an n-th stage ('n' is a natural number) comprising:
an output node configured to output an n-th gate signal from the n-th stage;
a control node;
a pull-up part configured to pull up the output node to the high voltage of a first clock signal as the high voltage of the n-th gate signal in response to a high voltage of the control node;
a pull-down part configured to pull down the high voltage of the n-th gate signal to a first low voltage level in response to the (n+1)th carry signal outputted from the following (n+1)th stage;
a first discharging part configured to discharge the high voltage of the control node to the first low voltage or to a second low voltage lower than the first low voltage in response to the (n+1)th carry signal outputted from the following (n+1)th stage;
a carry part configured to output the high voltage of the first clock signal as an n-th carry signal in response to the high voltage of the control node,
wherein the n-th stage further comprises a second discharging part configured to discharge a voltage of the control node into the first low voltage or the second low voltage into the second low voltage in response to an (n+2)th carry signal outputted from an (n+2)th stage.

28. The display apparatus of claim 27, wherein the n-th stage further comprises a third discharging part configured to discharge the n-th carry signal into the second low voltage in response to the (n+1)th carry signal outputted from the following (n+1)th stage.

29. The display apparatus of claim 27, wherein the n-th stage further comprises a second holding part configured to maintaining the voltage of the control node at the second low voltage.

30. The display apparatus of claim 27, wherein the n-th stage further comprises a switching part configured to output a signal synchronized with the fit clock signal during an interval excepting the output interval of the n-th carry signal of a frame.

31. The display apparatus of claim 30, wherein the n-th stage further comprises a first holding part configured to maintain the n-th carry signal at the second low voltage in response to an output signal of the switching part.

32. The display apparatus of claim 30, wherein the n-th stage further comprises a second holding part configured to maintain the voltage of the control node at the second low voltage in response to an output signal of the switching part.

33. The display apparatus of claim 30, wherein the n-th stage further comprises a third holding part configured to maintain the n-th gate signal at the first low voltage level in response to an output signal of the switching part.

34. The display apparatus of claim 27, wherein the voltage between a control gate and an output electrode of the pull-up part after a high voltage of the n-th gate signal is outputted is maintained at a negative voltage.

35. The display apparatus of claim 27, wherein n-th stage further comprises:
a buffer part comprising a control gate and an input electrode that are connected to a first input terminal receiving an (n−1)th carry signal from an (n−1)th stage and an output electrode connected to the control node; and
a charging part comprising a first terminal connected to the control node and a second terminal connected to an output node outputting the n-th gate signal.

* * * * *